(12) United States Patent
Ryu et al.

(10) Patent No.: US 8,698,239 B2
(45) Date of Patent: Apr. 15, 2014

(54) SEMICONDUCTOR DEVICES HAVING ASYMMETRIC DOPED REGIONS AND METHODS OF FABRICATING THE SAME

(75) Inventors: Ji-Do Ryu, Suwon-si (KR); Hee-Seog Jeon, Suwon-si (KR); Hyun-Khe Yoo, Suwon-si (KR); Yong-Suk Choi, Hwaseong-si (KR)

(73) Assignee: Samsung Electronics Co., Ltd. (KR)

(*) Notice: Subject to any disclaimer, the term of this patent is extended or adjusted under 35 U.S.C. 154(b) by 243 days.

(21) Appl. No.: 13/352,194

(22) Filed: Jan. 17, 2012

(65) Prior Publication Data

US 2012/0181607 A1 Jul. 19, 2012

(30) Foreign Application Priority Data

Jan. 18, 2011 (KR) .................. 10-2011-0005126

(51) Int. Cl.
| | |
|---|---|
| *H01L 29/66* | (2006.01) |
| *H01L 29/423* | (2006.01) |
| *H01L 29/788* | (2006.01) |
| *H01L 21/28* | (2006.01) |
| *H01L 27/115* | (2006.01) |
| *H01L 27/02* | (2006.01) |

(52) U.S. Cl.
CPC ...... *H01L 29/42328* (2013.01); *H01L 29/7883* (2013.01); *H01L 21/28273* (2013.01); *H01L 27/11519* (2013.01); *H01L 27/11524* (2013.01); *H01L 27/0207* (2013.01); *H01L 27/11504* (2013.01); *H01L 27/11565* (2013.01)
USPC ..... 257/337; 257/235; 257/E27.06; 257/E21.209; 257/E21.662

(58) Field of Classification Search
CPC ................ H01L 21/28273; H01L 27/11519; H01L 27/11524; H01L 29/42328; H01L 29/7883; H01L 27/0207; H01L 27/11504; H01L 27/11565
See application file for complete search history.

(56) References Cited

U.S. PATENT DOCUMENTS

| | | | | |
|---|---|---|---|---|
| 6,320,219 | B1 * | 11/2001 | Vajana et al. ................. | 257/321 |
| 6,620,679 | B1 * | 9/2003 | Tzeng et al. ................. | 438/250 |
| 2008/0054345 | A1 | 3/2008 | Park et al. | |
| 2010/0163965 | A1 | 7/2010 | Kwon | |

FOREIGN PATENT DOCUMENTS

| | | |
|---|---|---|
| KR | 1999-0032657 A | 5/1999 |
| KR | 10-0852236 B1 | 8/2008 |
| KR | 10-2010-0020668 A | 2/2010 |
| KR | 10-2010-0080244 A | 7/2010 |

* cited by examiner

*Primary Examiner* — Yasser A Abdelaziez
(74) *Attorney, Agent, or Firm* — Myers Bigel Sibley & Sajovec, P.A.

(57) ABSTRACT

A semiconductor device includes an active region in a substrate, first to third gate structures crossing the active region and sequentially arranged parallel to each other, a first doped region in the active region between the first and second gate structures and having a first horizontal width and a first depth, and a second doped region in the active region between the second and third gate structures and having a second horizontal width and a second depth. The second horizontal width is larger than the first horizontal width and the second depth is shallower than the first depth. A distance between the first and second gate structures adjacent to each other is smaller than that between the second and third gate structures adjacent to each other. Related fabrication methods are also described.

15 Claims, 13 Drawing Sheets

SEMICONDUCTOR DEVICES HAVING ASYMMETRIC DOPED REGIONS AND METHODS OF FABRICATING THE SAME

CROSS-REFERENCE TO RELATED APPLICATION

This U.S. non-provisional patent application claims priority under 35 U.S.C. §119 to Korean Patent Application No. 10-2011-0005126, filed on Jan. 18, 2011, the entire contents of which are hereby incorporated herein by reference in their entirety.

BACKGROUND

Various embodiments described herein relate to semiconductor devices and methods of fabricating the same. More specifically, various embodiments described herein relate to transistor structures that can be used in memory cells such as nonvolatile memory cells, and methods of fabricating same.

With the high integration of semiconductor devices, it is becoming important to ensure reliability of electrical characteristics of elements constituting the semiconductor devices. For example, in a nonvolatile memory having a 2-transistor (2-T) cell array structure that performs programming/erasing by Fowler-Nordheim (F-N) tunneling, it is possible to soft-program an adjacent unselected cell when a selected cell is programmed. The 2-T cell may include a MOS transistor serving as a switching device and a cell transistor including a material layer for storing information. The soft-programming of an adjacent unselected cell may impact the reliability of the device.

SUMMARY

In accordance with various embodiments described herein, a semiconductor device includes an active region in a semiconductor substrate, first to third gate structures sequentially arranged parallel to each other to cross the active region, a first doped region in the active region between the first and second gate structures and having a first horizontal width and a first depth, and a second doped region in the active region between the second and third gate structures and having a second horizontal width and a second depth. The second horizontal width may be larger than the first horizontal width and the second depth may be shallower than the first depth. A distance between the first and second gate structures adjacent to each other may be smaller than a distance between the second and third gate electrodes adjacent to each other.

In other embodiments, the second gate structure may include a second gate dielectric and a second conductive pattern, which are sequentially stacked on the semiconductor substrate. The second conductive pattern may overlap the first doped region with a first overlapping width and the second conductive pattern may overlap the second doped region by a second overlapping width smaller than the first overlapping width.

In still other embodiments, the first gate structure may include a first gate dielectric, a first lower conductive pattern, a first intermediate dielectric, a first upper conductive pattern, and a first gate capping pattern, which are sequentially stacked on the semiconductor substrate. The second gate structure may further include a second intermediate dielectric, a second upper conductive pattern, and a second gate capping pattern, which are sequentially stacked on the second conductive pattern. The third gate structure may include a third gate dielectric, a third lower conductive pattern, a third intermediate dielectric, a third upper conductive pattern, and a third gate capping pattern, which are sequentially stacked on the semiconductor substrate.

In yet other embodiments, the first gate structure may have a first width and the second gate structure may have a second width larger than the first width.

In yet other embodiments, the third gate structure may have the second width.

In yet other embodiments, the first doped region may include a first low concentration region having a first impurity concentration and a first intermediate concentration region having a second impurity concentration higher than the first impurity concentration. Side and bottom surfaces of the first intermediate concentration region may be surrounded by the first low concentration region.

In yet other embodiments, the second doped region may include a second low concentration region having a third impurity concentration lower than the second impurity concentration, a second intermediate concentration region having the second impurity concentration, and a first high concentration region having a fourth impurity concentration higher than the second impurity concentration. Side and bottom surfaces of the second intermediate concentration region may be surrounded by the second low concentration region and side and bottom surfaces of the first high concentration region may be surrounded by the second intermediate concentration region.

In yet other embodiments, the first low concentration region may extend to a first depth, the second low concentration region may extend to the second depth, the first and second intermediate concentration regions may extend to a third depth shallower than the second depth, and the first high concentration region may extend to a fourth depth shallower than the third depth.

In yet other embodiments, the second doped region may include a second low concentration region having a third impurity concentration lower than the second impurity concentration, a second intermediate concentration region having the second impurity concentration, and a first high concentration region having a fourth impurity concentration higher than the second impurity concentration. Side and bottom surfaces of the second intermediate concentration region may be surrounded by the second low concentration region and the first high concentration region and be narrower than the second intermediate concentration region and have a shallower depth and a narrower width than the second low concentration region.

In yet other embodiments, the first low concentration region may extend to a first depth, the second low concentration region may extend to a second depth shallower than the first depth, the first and second intermediate concentration regions may extend to a third depth shallower than the second depth, and the first high concentration region may extend to a fourth depth shallower than the second depth and deeper than the third depth.

In yet other embodiments, the semiconductor device may further include a third doped region provided in the active region opposite to the first doped region with the first gate structure interposed therebetween and the second and third doped regions may be the same depth.

In yet other embodiments, the first doped region may include a first low concentration region having a first impurity concentration and a first intermediate concentration region having a second impurity concentration higher than the first impurity concentration, the first intermediate concentration region having side and bottom surfaces surrounded by the first low concentration region. The second doped region may include a second low concentration region having a third impurity concentration lower than the second impurity concentration, a second intermediate concentration region having the second impurity concentration, the second intermediate concentration region having side and bottom surfaces surrounded by the second low concentration region, and a first high concentration region having a fourth impurity concentration higher than the second impurity concentration. The third doped region may include a third low concentration region having the first impurity concentration, a third intermediate concentration region having the second impurity concentration, the third intermediate concentration region having side and bottom surfaces surrounded by the third low concentration region, and a second high concentration region having the fourth impurity concentration.

In yet other embodiments, the first and third low concentration regions may have the same depth and the first and third intermediate concentration regions may have the same depth.

In yet other embodiments, the first high concentration region may be shallower than the second low concentration region and deeper than the second intermediate concentration region. The second high concentration region may be shallower than the third low concentration region and deeper than the third intermediate concentration region.

In yet other embodiments, the second doped region may include a region having a higher impurity concentration than the first doped region.

In yet other embodiments, the semiconductor device may further include a third doped region provided in the active region opposite to the first doped region with the first gate structure interposed therebetween. The first doped region and the third doped region may extend to the same depth.

In accordance with various other embodiments described herein, a semiconductor device includes a semiconductor substrate and an active region in the semiconductor substrate, including a line-shaped device region and a line-shaped common region crossing the line-shaped device region. A first doped region in the device region extends to a first depth and a first width. A second doped region in a region in which the device region and the common region cross each other extends to a second depth shallower than the first depth and a second width larger than the first width. A third doped region in the device region is spaced apart from the first doped region and arranged opposite to the second doped region with the first doped region interposed therebetween. A first gate structure on the device region between the first and third doped regions, a second gate structure on the device region between the first and second doped regions, and a third gate structure on the device region opposite to the second gate structure with the second doped region interposed therebetween, are also provided. The first doped region and the second gate structure may overlap by a first overlapping width and the second doped region and the second gate structure may overlap by a second overlapping width smaller than the first overlapping width.

In other embodiments, the semiconductor device may further include a spacer structure configured to fill a space between the first and second gate structures, a first spacer on a sidewall of the first gate structure adjacent to the third doped region, a second spacer on a sidewall of the second gate structure adjacent to the second doped region, and a third spacer on a sidewall of the third gate structure adjacent to the second doped region.

In still other embodiments, the semiconductor device may further include first inner spacers on both sidewalls of the first gate structure, second inner spacers on both sidewalls of the second gate structure, third inner spacers on both sidewalls of the third gate structure, a spacer pattern configured to fill a space between a first inner spacer and a second inner spacer disposed between a sidewall of the first gate structure and a sidewall of the second gate structure, which are adjacent to each other, a first outer spacer on the first inner spacer of the sidewall of the first gate structure adjacent to the third doped region, a second outer spacer on the second inner spacer of the sidewall of the second gate structure adjacent to the second doped region, and a third outer spacer on the third inner spacer of the sidewall of the third gate structure adjacent to the second doped region. The second and third outer spacers adjacent to each other may be spaced apart from each other.

In accordance with various other embodiments described herein, a semiconductor device may include an active region including a line-shaped common region and first to third device regions crossing the common region and arranged parallel to each other. First and third gate structures are sequentially arranged parallel to each other to cross the first to third device regions. A first doped region is in the active region between the first and second gate structures and having a first horizontal width and a first depth. A second doped region is in the active region between the second and third gate structures and having a second horizontal width larger than the first horizontal width and a second depth shallower than the first depth. A third doped region is in the active region opposite to the first doped region with the first gate structure interposed therebetween. An interlayer insulating layer is on the first to third doped regions and the first to third gate structures. A first conductive plug is configured to penetrate the interlayer insulating layer and electrically connected to the second doped region. A second conductive plug is configured to penetrate the interlayer insulating layer and electrically connected to the third doped region, a first conductive pattern on the first conductive plug, and a second conductive pattern on the second conductive plug. A distance between the first and second device regions may be smaller than a distance between the second and third device regions. The common region may be provided between the second and third gate structures. The first doped region and the second gate structure may overlap by a first overlapping width and the second doped region and the second gate structure may overlap by a second overlapping width smaller than the first overlapping width. The first conductive plug may be electrically connected to the second doped region in the common region disposed between the second and third device regions. The first and second conductive patterns may have line shapes crossing the common region.

A semiconductor device according to various other embodiments described herein includes first, second and third gate structures sequentially arranged on an active region of a semiconductor substrate and spaced apart from one another, wherein adjacent surfaces of the first and second gate structures and adjacent surfaces of the second and third gate structures are spaced apart from one another by different distances. A first doped region is provided in the active region between the first and second gate structures, and a second doped region is provided in the active region between the second and third gate structures. The first doped region overlaps the second gate structure and the second doped region overlaps the second gate structure by different distances and/or the first doped region and the second doped region extend into the semiconductor substrate to different depths.

In other embodiments, the adjacent surfaces of the first and second gate structures are closer together than the adjacent surfaces of the second and third gate structures. Moreover, the first doped region overlaps the second gate structure more than the second doped region overlaps the second gate structure and/or the first doped region extends deeper into the semiconductor substrate than the second doped region.

According to yet other embodiments, the second and third gate structures have the same width, and the widths of the second and third gate structures are different than that of the first gate structure.

In still other embodiments, the first and second doped regions include different numbers of sub-regions of different doping concentrations.

In yet other embodiments, the first gate structure includes a first gate dielectric, a first lower conductive pattern, a first intermediate dielectric, and a first upper conductive pattern, which are sequentially stacked, and each of the second and third gate structures includes a second gate dielectric, a second lower conductive pattern, a second intermediate dielectric, and a second upper conductive pattern, which are sequentially stacked.

Details of other embodiments are included in the detailed description and drawings.

BRIEF DESCRIPTION OF THE DRAWINGS

Various embodiments described herein will be more clearly understood from the following detailed description taken in conjunction with the accompanying drawings in which.

DETAILED DESCRIPTION

Figure 1:
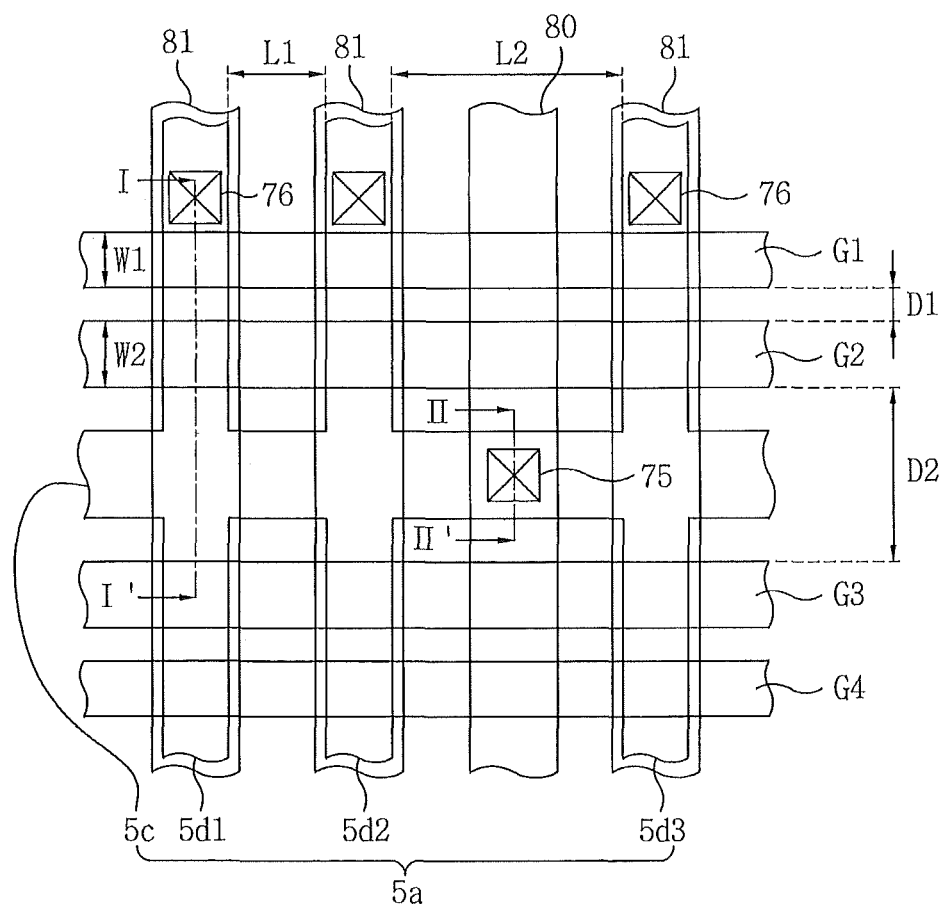
FIG. 1 is a plan view illustrating a semiconductor device according to various embodiments described herein.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element, such as a layer, a region, or a substrate, is referred to as being "on," "connected to", "coupled to" or "responsive to" another element, it may be directly on, connected, coupled or responsive to the other element or intervening elements may be present. In contrast, when an element is referred to as being "directly on", "directly connected to", "directly coupled to" or "directly responsive to" another element, there are no intervening elements present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Various embodiments are described herein with reference to cross-sectional and/or plan illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view illustrating a semiconductor device according to various embodiments described herein. FIGS. 2 to 7 are cross-sectional views illustrating semiconductor devices according to various embodiments described herein. In FIGS. 2 to 7, a region denoted as reference numeral "A" is a region taken along line I-I' of FIG. 1 and a region denoted as reference numeral "B" is a region taken along line II-II' of FIG. 1.

First, a structure of a semiconductor device according to various embodiments described herein will be described with reference to FIGS. 1 and 2.

Figure 2:
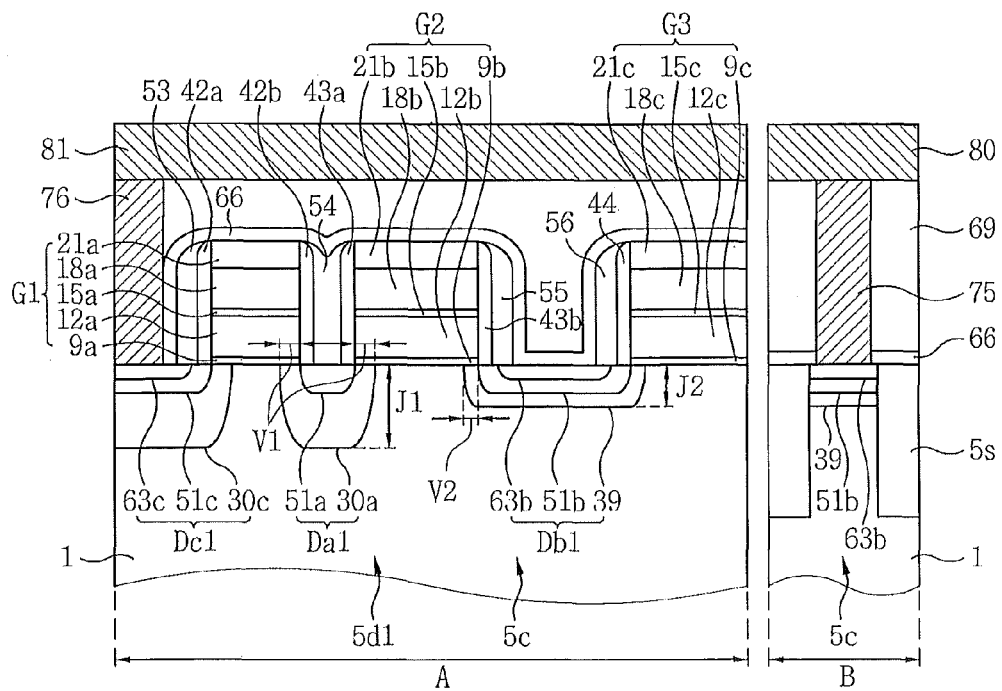
FIG. 2 is a cross-sectional view illustrating a semiconductor device according to various embodiments described herein.

Referring to FIGS. 1 and 2, a substrate 1 may be prepared. The substrate 1 may include a single element and/or compound semiconductor material in bulk wafer and/or layer form. A device isolation region 5s defining an active region 5a may be provided in the substrate 1. The active region 5a may include a plurality of line-shaped device regions and a line-shaped common region 5c that crosses the device regions.

The device regions may include first to third device regions 5d1, 5d2, and 5d3 parallel to one another. The first and second device regions 5d1 and 5d2 adjacent to each other may be spaced apart by a first distance L1 and the second and the third device regions 5d2 and 5d3 adjacent to each other may be spaced by a second distance L2 which is larger than the first distance L1.

Gate structures crossing the device regions 5d1, 5d2, and 5d3 of the active region 5a may be provided. The gate structures may include first to fourth gate structures G1, G2, G3, and G4.

In some embodiments, the gate structures G1 to G4 may have mirror-image symmetry with respect to the common region 5c. That is, the first and second gate structures G1 and G2 may have a mirror-symmetric structure with the third and fourth gate structures G3 and G4 with the common regions 5c interposed therebetween. The second and third gate structures G2 and G3 may be closer to the common region 5c than the first and fourth gate structures G1 and G4.

Each of the first and fourth gate structures G1 and G4 may have a first width W1 and each of the second and third gate structures G2 and G3 may have a second width W2 larger than the first width W1.

Further, the distance D2 between the second and the third gate structures G2 and G3 adjacent to each other may larger than the distance D1 between the first and second gate structures G1 and G2 adjacent to each other.

The first gate structure G1 may include a first gate dielectric 9a, a first lower conductive pattern 12a, a first intermediate dielectric 15a, a first upper conductive pattern 18a, and a first gate capping pattern 21a, which are sequentially stacked. The second gate structure G2 may include a second gate dielectric 9b, a second lower conductive pattern 12b, a second intermediate dielectric 15b, a second upper conductive pattern 18a, and a second gate capping pattern 21b, which are sequentially stacked. The third gate structure G3 may include a third gate dielectric 9c, a third lower conductive pattern 12c, a third intermediate dielectric 15c, a third upper conductive pattern 18c, and a third gate capping pattern 21c.

The first to third gate dielectrics 9a, 9b, and 9c may include a silicon oxide layer, a silicon oxynitride (SiON) layer, nitrogen-doped silicon oxide layer and/or a high-k dielectric layer. The high dielectric layer may include a dielectric layer having a higher dielectric constant than a silicon oxide layer, such as an aluminum oxide (A10) layer, a zirconium oxide (ZrO) layer, a hafnium oxide (HfO) layer and/or a lanthanum oxide (LaO) layer.

The first to third lower conductive patterns 12a, 12b, and 12c may include a polysilicon layer. The first to third intermediate dielectrics 15a, 15b, and 15c may include an oxide/nitride/oxide (ONO) layer, an AlO layer, a HfO layer, a hafnium silicon oxide (HfSiO) layer, a hafnium aluminum oxide (HfAlO) layer, a tantalum oxide (TaO) layer, a ZrO layer, a LaO layer, and/or a titanium oxide (TiO) layer. The first to third upper conductive patterns 18a, 18b and 18c may include a polysilicon layer, a metal layer, a metal nitride layer, and/or a metal silicide layer. The first to third gate capping patterns 21a, 21b, and 21c may comprise an insulating material such as silicon oxide and/or silicon nitride.

A first doped region Da1 may be provided in the active region 5a between the first and second gate structures G1 and G2 adjacent to each other. The first doped region Da1 may include a first low concentration region 30a and a first intermediate concentration region 51a. The first intermediate concentration region 51a may have a higher impurity concentration than the first low concentration region 30a and may have a shallower depth than the first low concentration region 30a. Further side and bottom surfaces of the first intermediate concentration region 51a may be surrounded by the first low concentration region 30a.

A second doped region Db1 may be provided in the active region between the second and third gate structures G2 and G3. The second doped region Db1 may be provided in the common region 5c and extend to each of the device regions 5d1, 5d2, and 5d3 adjacent to the second and third gate structures G2 and G3.

The second doped region Db1 may include a second low concentration region 39, a second intermediate concentration region 51b, and a first high concentration region 63b. The second intermediate concentration region 51b may have a shallower depth than the second low concentration region 39 and side and bottom surfaces of the second intermediate concentration region 51b may be surrounded by the second low concentration region 39. The first high concentration region 63b may have a shallower depth than the second intermediate concentration region 51b and side and bottom surfaces of the first high concentration region 63b may be surrounded by the second intermediate concentration region 51b.

A third doped region Dc1 may be provided in the active region opposite to the first doped region Da1 with the first gate structure G1 interposed therebetween.

The third doped region Dc1 may include a third low concentration region 30c, a third intermediate concentration region 51c, and a second high concentration region 63c. The third intermediate concentration region 51c may have a shallower depth than the third low concentration region 30c and side and bottom surfaces of the third intermediate concentration region 51c may be surrounded by the third low concentration region 30c. The second high concentration region 63c may have a shallower depth than the third intermediate concentration region 51c and side and bottom surfaces of the second high concentration region 63c may be surrounded by the third intermediate concentration layer 51c.

The first and third low concentration regions 30a and 30c may be formed by the same ion implantation process to have the same depth. The first and third low concentration regions 30a and 30c may have a first depth J1 and the second low concentration region 39 may have a second depth J2 shallower than the first depth J1.

The first to third intermediate concentration regions 51a, 51b, and 51c may be formed by the same ion implantation process to have the same depth. The first and second high concentration regions 63b and 63c may be formed by the same ion implantation process to have the same depth.

In other embodiments, the second low concentration region 39 may have a different depth from that of the first low concentration region 30a and have a lower impurity concentration than the first low concentration region 30a.

In still other embodiments, the second low concentration region 39 may have a different depth from that of the first low concentration region 30a and have an impurity concentration which is equal to or higher than that of the first low concentration region 30a.

A width V1 of an overlapping portion between the first or second gate structure G1 or G2 and the first doped region Da1 may be larger than a width V2 of an overlapping portion between the second gate structure G2 and the second doped region Db1.

A spacer structure may be provided to fill a space between the first and second gate structures G1 and G2. A first spacer structure 42a and 53 may be provided on a sidewall of the first gate structure G1 adjacent to the third doped region Dc1, a second spacer structure 43b and 55 is provided on a sidewall of the second gate structure G2 adjacent to the second doped region Db1, and a third spacer structure 44 and 56 may be provided on a sidewall of the third gate structure G3 adjacent to the second doped region Db1. Alternatively, a first spacer structure 42a, 42b, 53 and 54 may be provided on both sidewalls of the first gate structure G1, and a second spacer structure 43a, 43b, 54 and 55 may be provided on both sidewalls of the second gate structure G2. A third spacer structure 44 and 56 may be provided on both sidewalls of the third gate structure G3.

More specifically, first inner spacers 42a and 42b may be provided on both sidewalls of the first gate structures G1, second inner spacers 43a and 43b may be provided on both sidewalls of the second gate structure G2, and third inner spacers 44 may be provided on both sidewalls of the third gate structure G3. Further, a spacer pattern 54 configured to fill a space between the first and second inner spacer 42b and 43a which are disposed between the respective sidewalls of the first and second gate structures G1 and G2, which are adjacent to each other, may be provided. A first outer spacer 53 may be provided on the first inner spacer 42a of the sidewall of the first gate structure G1, which is adjacent to the third doped region Dc1, a second outer spacer 55 may be provided on the second inner spacer 43b of the sidewall of the second gate structure G2, which is adjacent to the second doped region Db1, and a third outer spacer 56 may be provided on the third inner spacer 44 of the sidewall of the third gate structure G3, which is adjacent to second doped region Db1. At this time, the second and third outer spacers 55 and 56 which are adjacent to each other and provided on the second doped region Db1 may be spaced apart from each other.

An etch stop layer 66 may be provided on the substrate including the first to four gate structures G1 to G4 and the spacers 42a, 42b, 43a, 43b, 44, and 53 to 56. The etch stop layer 66 may comprise an insulating material. For example, when the device isolation region 5s comprises silicon oxide, the etch stop layer 66 may comprise a different material from silicon oxide, for example, silicon nitride. An interlayer insulating layer 69 may be provided on the substrate including the etch stop layer 66. The interlayer insulating layer 69 may comprise silicon oxide. The etch stop layer 66 and the interlayer insulting layer 69 may have different etch selectivities from each other.

A first contact plug 75 which vertically penetrate the interlayer insulating layer 69 and the etch stop layer 66 and is electrically and/or physically connected to the second doped region Db1, and a second contact plug 76 electrically and/or physically connected to the third doped region Dc1 may be provided. Here, the first contact plug 75 may be on the second doped region Db1 in the common region 5c disposed between the second device region 5d2 and the third device region 5d3 which have a relatively larger distance among the device regions.

A first conductive pattern 80 covering the first contact plug 75 and a second conductive pattern 81 covering the second contact plug 76 may be on the interlayer insulating layer 69. The plurality of second conductive patterns 81 may be provided to overlap the device regions 5d1, 5d2, and 5d3, respectively.

In some embodiments, the first to third doped regions Da1, Db1, and Dc1 may include phosphorous (P) and/or arsenic (As) to form N-type regions, and the active region 5a may form a P-type well. Further, among elements constituting the first to third doped regions Da1, Db1, and Dc1, the first to third low concentration regions 30a, 39, and 30c having the deepest depth and the lowest impurity concentration may be provided to surround the sides and bottoms of the intermediate and high concentration regions 51a, 51b, 51c, 63b, and 63c having relatively higher impurity concentrations and relatively shallower depths. Therefore, the first to third low concentration regions 30a, 39, and 30c having relatively lower impurity concentrations form deep junctions so that degradation of electrical characteristics of the semiconductor device due to punch-through and a leakage current may be reduced or prevented.

The elements described in various embodiments described herein may be defined as elements for constituting a nonvolatile memory device. For example, the first doped region Da1 may be defined as a floating region, the second doped region Db1 may be defined as a common source region, and the third doped region Dc1 may be defined as a drain region. Further, the first gate structure G1 may be defined as a memory gate and the second gate structure G2 may be defined as a select gate. Here, in the second gate structure G2 defined as the select gate, the second lower conductive pattern 12b and the second upper conductive pattern 18b may be electrically and/ or physically connected to each other. For example, the second intermediate dielectric 15b between the second lower and upper conductive patterns 12b and 18b may be partially or completely omitted so that the second lower and upper conductive patterns 12b and 18b may be physically and/or electrically connected to each other. The first lower conductive pattern 12a of the first gate structure G1 defined as the memory gate may be defined as a floating gate of a flash memory device. Therefore, the first lower conductive pattern 12a of the first gate structure G1 may serve as a floating gate for storing data of the nonvolatile memory device. The first and second gate structures G1 and G2 overlapping any one of the device regions 5d1, 5d2, and 5d3 may constitute one memory cell and/or a cell string. The nonvolatile memory device having the elements can be programmed and/or erased using F-N tunneling.

The second doped region Db1 that may be defined as the common source region may have a shallower depth than the first doped region Da1 that may be defined as the floating region. Further, the overlapping width V1 between the first doped region Da1 and the first gate structure G1 may be larger than the second overlapping width V2 between the second doped region Db1 and the second gate structure G2. Since the overlapping width V2 between the second doped region Db1 and the second gate structure G2 may be reduced, a distance between the first and second doped regions Da1 and Db1 is increased so that a width of an effective channel of a transistor may be increased. Thus, degradation of electrical characteristics of the transistor due to a short channel may be reduced or suppressed. Further, since punch-through of the transistor can be suppressed, undesired turning-on of the second gate structure G2 may be reduced or prevented. Thus, electrons are injected into the first lower conductive pattern 12a which may correspond to a floating gate of the first gate structure G1 which may correspond to the memory gate by a hot carrier effect, so that change of electrical characteristics of the first lower conductive pattern 12a may be reduced or prevented.

Figure 3:
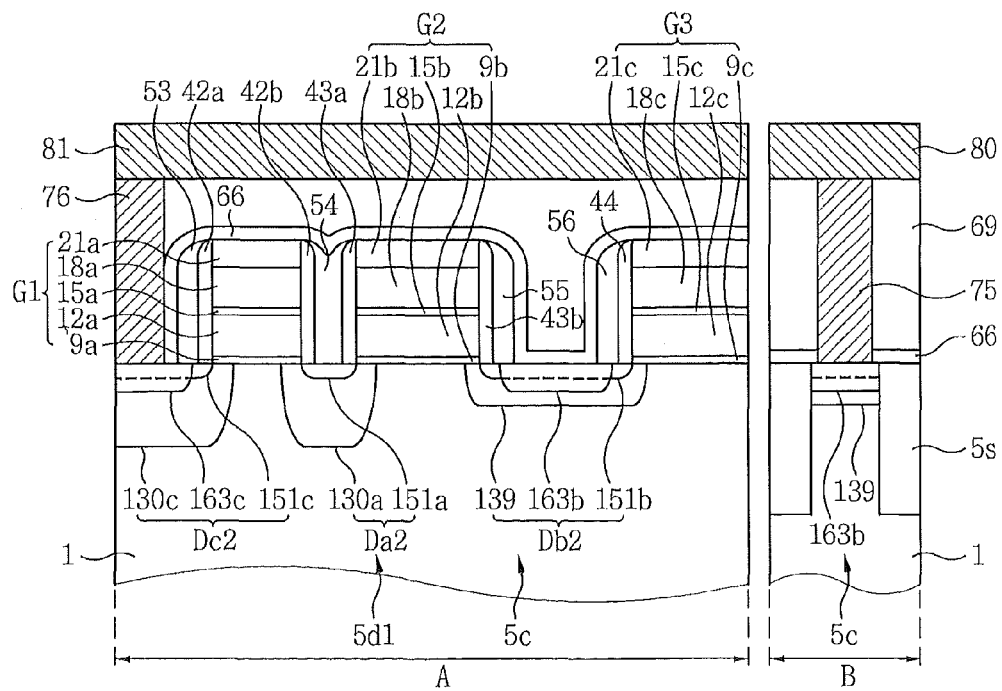
FIG. 3 is a cross-sectional view illustrating a semiconductor device according to various other embodiments described herein.

On the other hand, the first to third doped regions Da1, Db1, and Dc1 described in FIG. 2 may be modified to first to third doped regions Da2, Db2, and Dc2 illustrated in FIG. 3. That is, a semiconductor device in FIG. 3 is slightly different from that illustrated in FIG. 2 in view of doped regions, and the other elements are substantially the same as those of the semiconductor device in FIG. 2, and thus the modified doped regions will be mainly described below with reference to FIG. 3.

Referring to FIG. 3, the first doped region Da2 may be provided in an active region 5a between first and second gate structures G1 and G2 adjacent to each other. The first doped region Da2 may include a first low concentration region 130a and a first intermediate concentration region 151a. The first intermediate concentration region 151a may have a higher impurity concentration than the first low concentration region 130a and have a shallower depth than the first low concentration region 130a. Side and bottom surfaces of the first intermediate concentration region 151a may be surrounded by the first low concentration region 130a.

The second doped region Db2 may be provided in the active region 5a between the second gate structure G2 and a third gate structure G3. The second doped region Db2 may include a second low concentration region 139, a second intermediate concentration region 151b, and a first high concentration region 163b. The second intermediate concentration region 151b may have a shallower depth than the second low concentration region 139 and side and bottom surfaces of the second intermediate concentration region 151b may be surrounded by the second lower concentration region 139.

The first high concentration region 163b may have a depth deeper than a depth of the second intermediate concentration region 151b. The first high concentration region 163b may have a smaller width than the second intermediate concentration region 151b. For example, the first high concentration region 163b may be a region that has a smaller width than the second intermediate concentration region 151b and extends into a substrate 1 from an intermediate region of a top surface of the second intermediate concentration region 151b to penetrate the second intermediate concentration region 151b.

The third doped region Dc2 may be provided in the active region 5a opposite to the first doped region Da2 with the first gate structure G1 interposed therebetween. The third doped region Dc3 may include a third low concentration region 130c, a third intermediate concentration region 151c, and a second high concentration region 163c. The third intermediate concentration region 151c may have a shallower depth than the third low concentration region 130c and side and bottom surfaces of the third intermediate concentration region 151c may be surrounded by the third low concentration region 130c. The second high concentration region 163c may have a deeper depth than the third intermediate concentration region 151c.

The first and third low concentration regions 130a and 130c may be formed by the same ion implantation process to have the same depth. The first to third intermediate concentration regions 151a, 151b, and 151c may be formed by the same ion implantation process to have the same depth. Further, the first and second high concentration regions 163b and 163c may be formed by the same ion implantation process to have the same depth. The first and second high concentration regions 163b and 163c may have deeper depths than the second and third intermediate concentration regions 151b and 151c. The first and second high concentration regions 163b and 163c may have shallower depths than the second and third low concentration regions 139 and 130c.

The second low concentration region 139 may be provided to have a deeper depth than the second intermediate concentration region 151b and the first high concentration region 163b and to have a larger width than the second intermediate concentration region 151b and the first high concentration region 163b. Side and bottom surfaces of an impurity region including the second intermediate concentration region 151b and the first high concentration region 163b may be surrounded by the second low concentration region 139.

Figure 4:
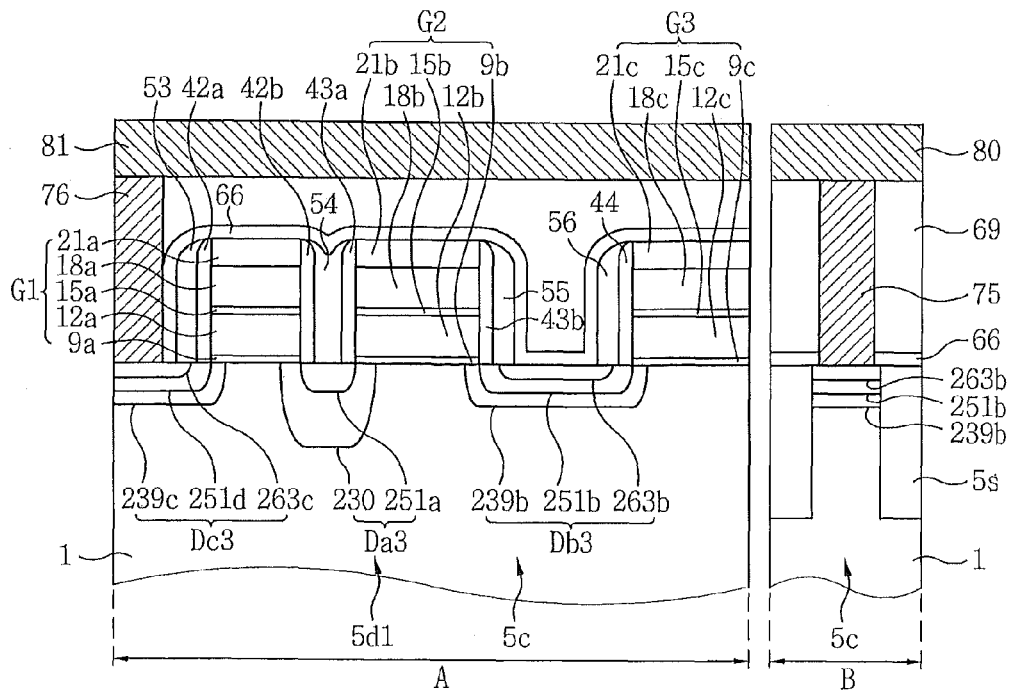
FIG. 4 is a cross-sectional view illustrating a semiconductor device according to still various other embodiments described herein.

On the other hand, the first to third doped regions Da1, Db1, and Dc1 described in FIG. 2 may be modified to first to third doped regions Da3, Db3, and Dc3 in FIG. 4. Hereinafter, as in FIG. 3, the modified doped regions will be mainly described with reference to FIG. 4.

Referring to FIG. 4, the first doped region Da3 may be provided in an active region 5a between first and second gate structures G1 and G2 adjacent to each other. The first doped region Da3 may include a first low concentration region 230 and a first intermediate concentration region 251a. The first doped region Da3 of FIG. 4 may have the same structure as the first doped region Da1 of FIG. 2.

The second doped region Db3 may be provided in the active region 5a between the second gate structure G2 and a third gate structure G3. The second doped region Db3 may include a second low concentration region 239b, a second intermediate concentration region 251b, and a first high concentration region 263b. The second doped region Db3 of FIG. 4 may have the same structure as the second doped region Db1 of FIG. 2.

The third doped region Dc3 may include a third low concentration region 239c, a third intermediate concentration region 251c, and a second high concentration region 263c. The third intermediate concentration region 251c may have a shallower depth than the third low concentration region 239c and side and bottom surfaces of the third intermediate concentration region 251c may be surrounded by the third low concentration region 239c. The second high concentration region 263c may have a shallower depth than the third intermediate concentration region 251c and side and bottom surfaces of the second high concentration region 263c may be surrounded by the third intermediate concentration region 251c.

The second and third low concentration regions 239b and 239c may be formed by the same ion implantation process to have the same depth. The second and third low concentration regions 239b and 239c may have shallower depths than the first low concentration region 230.

The first to third intermediate concentration regions 251a, 251b, and 251c may be formed by the same ion implantation process to have the same depth. The first and second high concentration regions 263b and 263c may be formed by the same ion implantation process to have the same depth. The first and second high concentration regions 263b and 263c may have shallower depths than the second and third intermediate concentration regions 251b and the 251c.

Figure 5:
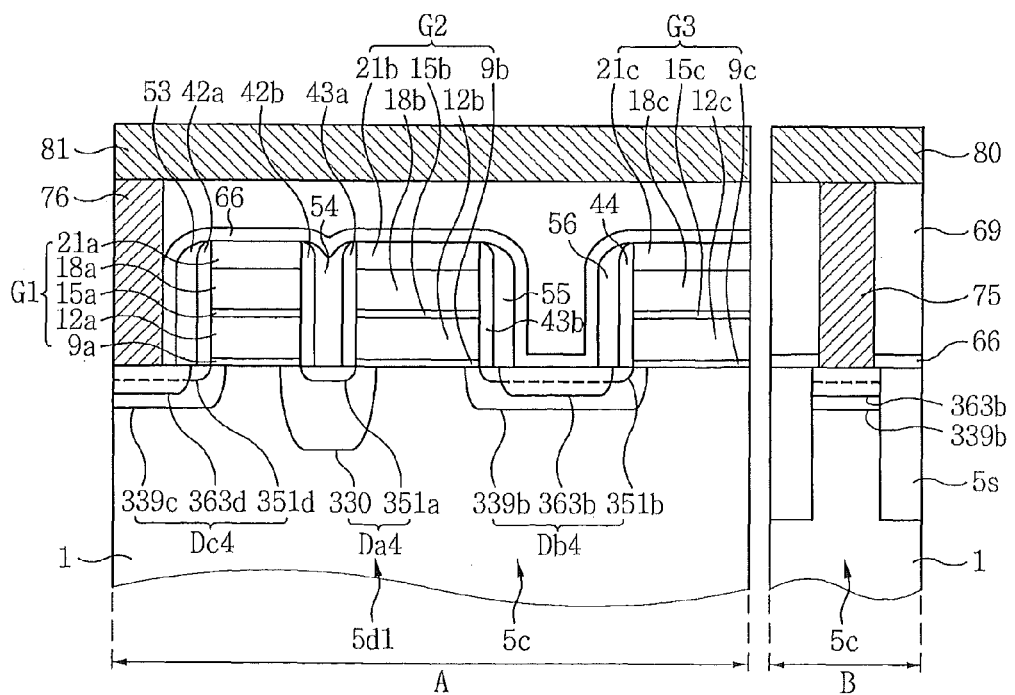
FIG. 5 is a cross-sectional view illustrating a semiconductor device according to yet various other embodiments described herein.

On the other hand, the first to third doped regions Da1, Db1, and Dc1 described in FIG. 2 may be modified to first to third doped regions Da4, Db4, Dc4 in FIG. 5. Hereinafter, as in FIG. 3, the modified doped regions will be mainly described with reference to FIG. 5.

Referring to FIG. 5, the first doped region Da4 may be provided in an active region 5a between first and second gate structures G1 and G2 adjacent to each other. The first doped region Da4 may include a first low concentration region 330 and a first intermediate concentration region 351a. The first doped region Da4 of FIG. 5 may have the same structure as the first doped region Da2 of FIG. 3.

The second doped region Db4 may be provided in the active region 5a between the second gate structure G2 and a third gate structure G3. The second doped region Db4 may include a second low concentration region 339b, a second intermediate concentration region 351b, and a first high concentration region 363b. The second doped region Db4 of FIG. 5 may have the same structure as the second doped region Db2 of FIG. 3.

The third doped region Dc4 may be provided in the active region 5a opposite to the first doped region Da4 with the first gate structure G1 interposed therebetween. The third doped region Dc4 may include a third low concentration region 339c, a third intermediate concentration region 351c, and a second high concentration region 363c. The third intermediate concentration region 351c may a shallower depth than the third low concentration region 339c and side and bottom surfaces of the third intermediate concentration region 351c may be surrounded by the third low concentration region 339c. The second high concentration region 363c may have a deeper depth than the third intermediate concentration region 351c.

The second and third low concentration regions 339b and 339c may be formed by the same ion implantation process to have the same depth. The second and third low concentration regions 339b and 339c may have shallower depths than the first low concentration region 330.

The first to third intermediate concentration regions 351a, 351b, and 351c may be formed by the same ion implantation process to have the same depth. Further, the first and second high concentration regions 363b and 363c may be formed by the same ion implantation process to have the same depth.

The first and second high concentration regions 363b and 363c may have deeper depths than the second and third intermediate concentration regions 351b and 351c. The first and second high concentration regions 363b and 363c may have shallower depths than the second and third low concentration regions 339b and 339c.

The second low concentration region 339b may be provided to have a deeper depth and a larger width than the second intermediate concentration region 351b and the first high concentration region 363b. Side and bottom surfaces of an impurity region including the second intermediate concentration region 351b and the first high concentration region 363b may be surrounded by the second low concentration region 339b. Likewise, side and bottom surfaces of an impurity region including the third intermediate concentration region 351c and the second high concentration region 363c may be surrounded by the third low concentration region 339c.

Next, a semiconductor device according to various other embodiments will be described with reference to FIG. 6.

Figure 6:
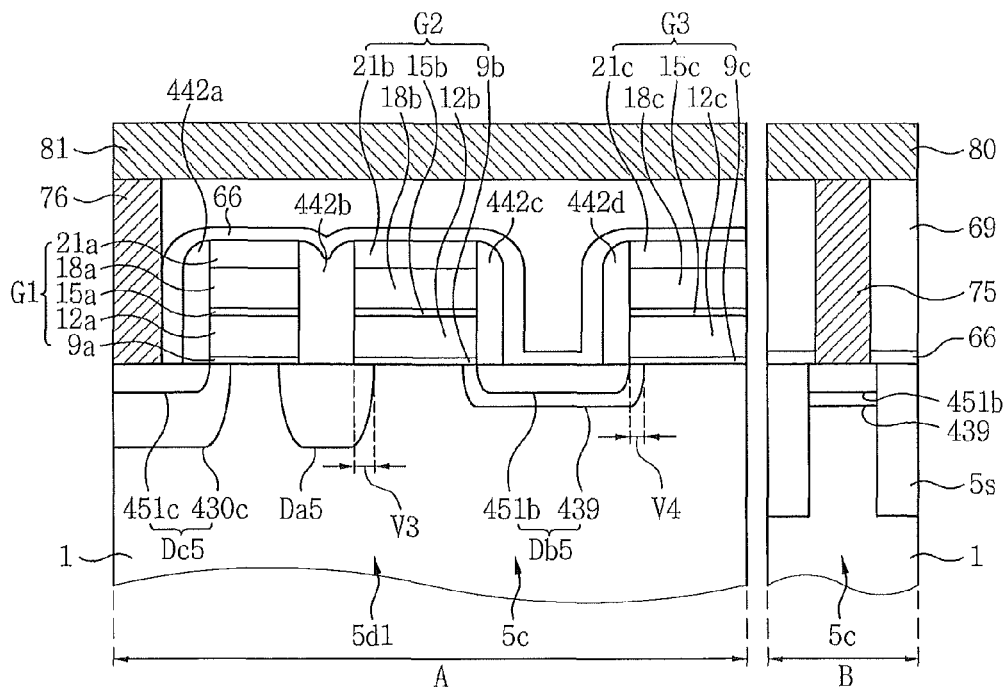
FIG. 6 is a cross-sectional view illustrating a semiconductor device according to still various other embodiments described herein.

Referring to FIGS. 1 and 6, as in FIG. 2, a device isolation region 5s defining an active region 5a may be provided in a substrate 1. The active region 5a may include a plurality of line-shaped device regions and a line-shaped common region 5c that crosses the device regions. The device regions may include first to third device regions 5d1, 5d2, and 5d3 parallel to each other. Further, as in FIG. 2, gate structures intersecting the device regions 5d1, 5d2, and 5d3 of the active region 5a may be provided. The gate structures may include first to fourth gate structures G1, G2, G3, and G4.

A first doped region Da5 may be provided in the active region 5a between the first and second gate structures G1 and G2 adjacent to each other. The first doped region Da5 may include a first low concentration region 430. A second doped region Db5 may be provided in the active region 5a between the second and third gate structures G2 and G3. The second doped region Db5 may include a second low concentration region 439 and a first high concentration region 451b. The first high concentration region 451b may have a shallower depth than the second low concentration region 439 and side and bottom surfaces of the first high concentration region 451b may be surrounded by the second low concentration region 439.

A third doped region Dc5 may be provided in the active region 5a opposite to the first doped region Da5 with the first gate structure G1 interposed therebetween. The third doped region Dc5 may include a third low concentration region 430c and a second high concentration region 451c.

The second high concentration region 451c may have a shallower depth than the third low concentration region 430c and side and bottom surfaces of the second high concentration region 451c may be surrounded by the third low concentration region 430c.

The first concentration region Da5 and the third low concentration region 430c may be formed by the same ion implantation process to have the same region. The first concentration region Da5 and the third low concentration region 430c may have deeper depths than the second low concentration region 439.

The first and second high concentration regions 451b and 451c may be formed by the same ion implantation process to have the same depth. The first and second high concentration regions 451b and 451c may have the shallower depths than the second low concentration region 439.

A width V3 of an overlapping portion between the second gate structure G2 and the first doped region Da5 may be larger than a width V4 of an overlapping portion between the second structure G2 and the second doped region Db5.

A spacer structure 442b filling between the first and second structures G1 and G2 may be provided.

A first spacer 442a may be provided on a sidewall of the first gate structure G1, which is adjacent to the third doped region Dc5. A second spacer 442c may be provided on a sidewall of the second gate structure G2, which is adjacent to the second doped region Db5. A third spacer 442d may be provided on a sidewall of the third gate structure G3, which is adjacent to the second doped region Db5. The first to third spacers 442a, 442c, and 442d and the spacer structure 442b may comprise an insulating material such as silicon oxide and/or silicon nitride.

Figure 7:
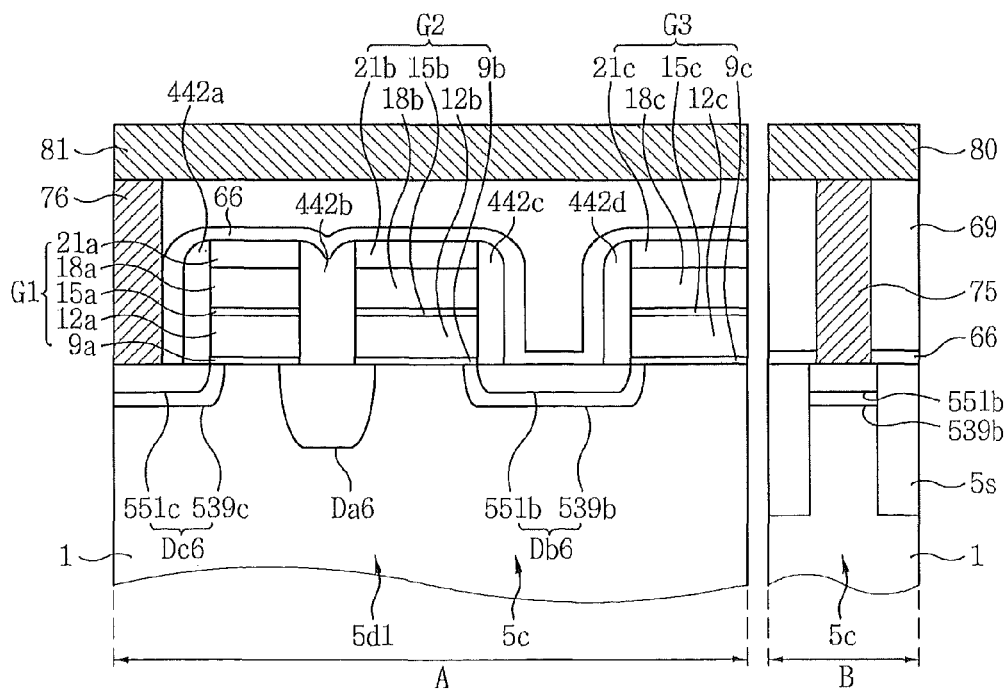
FIG. 7 is a cross-sectional views illustrating a semiconductor device according to yet various other embodiments described herein.

On the other hand, the first to third doped regions Da5, Db5, and Dc5 described in FIG. 6 may be modified to first to third doped regions Da6, Db6, and Dc6 of FIG. 7.

Referring to FIG. 7, the first doped region Da6 may be provided in an active region 5a between first and second gate structures G1 and G2 adjacent to each other. The first doped region Da6 may include a first low concentration region 530.

The second doped region Db6 may be provided in the active region 5a between the second gate structure G2 and a third gate structure G3. The second doped region Db6 may include a second low concentration region 539b and a first high concentration region 551b. The first high concentration region 551b may have a shallower depth than the second low concentration region 539b and side and bottom surfaces of the first high concentration region 551b may be surrounded by the second low concentration region 539b.

The third doped region Dc6 may be provided in the active region 5a opposite to the first doped region Da6 with the first gate structure G1 interposed therebetween. The third doped region Dc6 may include a third low concentration region 530c and a second high concentration region 551c.

The second high concentration region 551c may have a shallower depth than the third low concentration region 539c and side and bottom surfaces of the second high concentration region 551c may be surrounded by the third low concentration region 539c.

The second and third low concentration regions 539b and 539c may be formed by the same ion implantation process to have the same depth. The second and third low concentration regions 539b and 539c may have shallower depths than the first concentration region Da6.

The first and second high concentration regions 551b and 551c may be formed by the same ion implantation process to have the same depth. The first and second high concentration regions 551b and 551c may have shallower depths than the second and third low concentration regions 539b and 539c.

Hereinafter, methods of fabricating the semiconductor devices having the above-described structures will be described with reference to FIG. 8A to FIG. 13. FIGS. 8A to 13 illustrate regions taken along line I-I' of FIG. 1.

First, methods of fabricating a semiconductor device for forming the semiconductor device described in FIG. 2 will be described with reference to FIGS. 8A to 8E.

Figure 8A:
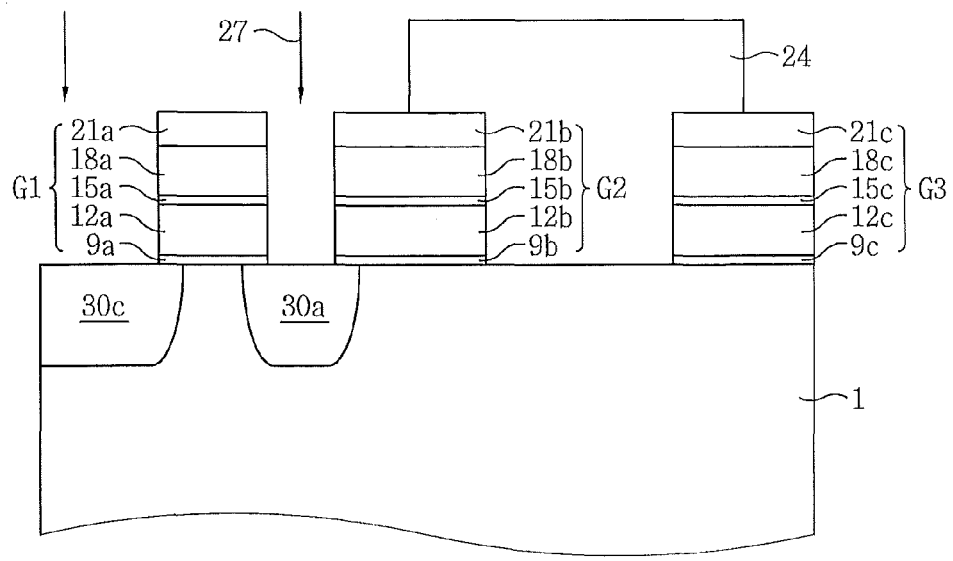
FIGS. 8A to 8E are cross-sectional views illustrating methods of fabricating a semiconductor device according to various embodiments described herein.

Referring to FIGS. 1 and 8A, a substrate 1 may be provided. The substrate 1 may include a single element and/or compound semiconductor material in bulk wafer and/or layer form. A device isolation region 5s defining an active region 5a may be provided in the substrate 1.

A gate dielectric layer, a lower conductive layer, an intermediate dielectric layer, an upper conductive layer, and a mask layer may be sequentially stacked on the substrate 1 and a photolithography process may be performed on the stacked results to form first to fourth gate structures G1 to G4 as in FIG. 2.

The first gate structure G1 may include a first gate dielectric 9a, a first lower conductive pattern 12a, a first intermediate dielectric 15a, a first upper conductive pattern 18a, and a first gate capping pattern 21a, which are sequentially stacked. The second gate structure G2 may include a second gate dielectric 9b, a second lower conductive pattern 12b, a second intermediate dielectric 15b, a second upper conductive pattern 18b, and a second gate capping pattern 21b, which are sequentially stacked. The third gate structure G3 may include a third gate dielectric 9c, a third lower conductive pattern 12c, a third intermediate dielectric 15c, a third upper conductive pattern 18c, and a third gate capping pattern 21c.

The first to third lower conductive patterns 12a, 12b, and 12c may comprise a polysilicon layer. The first to third intermediate dielectrics 15a, 15b, and 15c may include an ONO layer, an AlO layer, a HfO layer, a HfSiO layer, a HfAlO layer, a TaO layer, a ZrO layer, a LaO layer, and/or a TiO layer. The first to third upper conductive patterns 18a, 18b, and 18c may include a polysilicon layer, a metal layer, a metal nitride layer, and/or a metal silicide layer. The first to third gate capping patterns 21a, 21b, and 21c may include an insulating material such as silicon oxide and/or silicon nitride.

A first mask 24 which covers the active region 5a between the second and third gate structures G2 and G3 adjacent to each other and exposes the active region 5a at both sides of the first gate structure G1 and the active region 5a at both sides of the fourth gate structure G4 may be provided. The first mask 24 may be a photoresist pattern.

A first ion implantation process 27 may be performed using the first mask 24 and the gate structures G1 to G4 as an ion implantation mask to form low concentration regions 30a and 30c in the active region 5a. For example, a first low concentration region 30a may be provided in the active region 5a between the first and second gate structures G1 and G2 adjacent to each other and a third low concentration region 30c may be provided in the device region adjacent to one of both sidewalls of the first gate structure G1, which is relatively far from a common region 5c.

Subsequently, the first mask 24 may be removed.

Figure 8B:
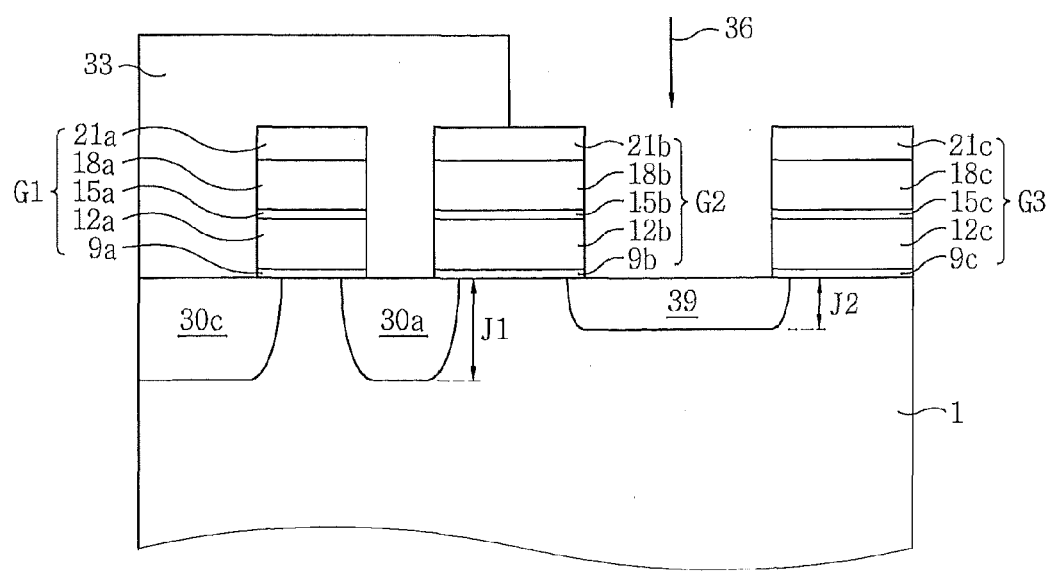

Referring to FIGS. 1 and 8B, a second mask 33 may be provided to expose the active region between the second and third gate structures G2 and G3 adjacent to each other and cover the active region at both sides of the first gate structure G1. The second mask 33 may be a photoresist pattern.

A second ion implantation process 36 may be performed using the second mask 33 and the gate structures G1 to G4 as an ion implantation mask to form a second low concentration region 39 in the active region between the second and third gate structures G2 and G3 adjacent to each other.

Therefore, the first low concentration region 30a may be provided in the active region between the first and second gate structures G1 and G2 adjacent to each other, the second low concentration region 39 may be provided in the active region between the second and third gate structures G2 and G3 adjacent to each other, and the third low concentration region 30c may be provided in the active region adjacent to one of both sidewalls of the first gate structure G1, which is relatively far from the common region 5c.

The first and third low concentration regions 30a and 30c are formed by the first ion implantation process 27 so that the first and third low concentration regions 30a and 30c may have the same impurity concentration and the same depth. The second low concentration region 39 may have a shallower depth than the first and third low concentration regions 30a and 30c. For example, the first ion implantation process 27 for forming the first and third low concentration regions 30a and 30c may be performed using an ion implantation energy of about 50 keV to about 60 keV and the second ion implantation process 36 for forming the second low concentration region 39 may be performed using an ion implantation energy of about 30 keV to about 40 keV. Therefore, the first and third low concentration regions 30a and 30c may have first depths J1 and the second low concentration region 39 may have a second depth J2 shallower than the first depth J1.

Meanwhile, the first ion implantation process 27 for first forming the first and third low concentration regions 30a and 30c may be performed at a dose of about $1\times12^{12}$ ions/cm$^2$ to $1\times10^{14}$ ions/cm$^2$ and the second ion implantation process 36 for forming the second low concentration region 39 may be performed at a dose of about $1\times12^{12}$ ions/cm$^2$ to $1\times10^{14}$ ions/cm$^2$.

Subsequently, the second mask 33 may be removed.

In FIGS. 8A and 8B, although a method of forming the first and third low concentration regions 30a and 30c and then forming the second low concentration region 39 has been described, but various embodiments described herein are not limited thereto. For example, after an ion implantation process for forming the second low concentration region 39 is first performed as shown in FIG. 8B, an ion implantation process for forming the first and third low concentration regions 30a and 30c may be performed as shown in FIG. 8A.

Figure 8C:
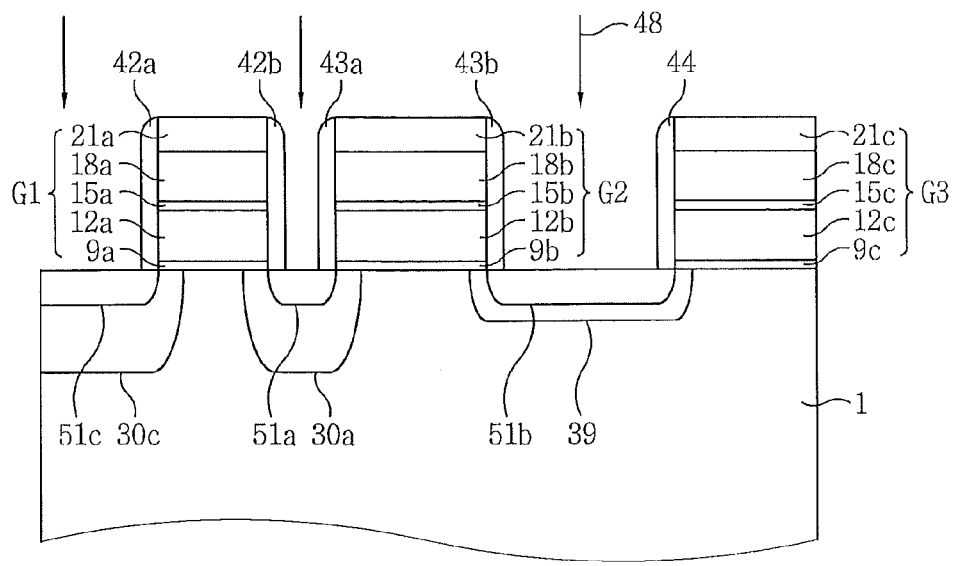

Referring to FIGS. 1 and 8C, an insulating inner spacer layer may be provided on the substrate including the gate structures G1 to G4 and anisotropically etched. As a result, inner spacers 42a, 42b, 43a, 43b, and 44 may be provided on sidewalls of the gate structures G1 to G4. The inner spacers 42a, 42b, 43a, 43b, and 44 may comprise an insulating material. For example, the inner spacers 42a, 42b, 43a, 43b, and 44 may comprise an insulting material such as silicon oxide, silicon nitride and/or silicon oxynitride.

Among the inner spacers 42a, 42b, 43a, 43b, and 44, inner spacers on both sidewalls of the first gate structure G1 may be defined as first inner spacers 42a and 42b and inner spacers on both sidewalls of the second gate structure G2 may be defined as second inner spacers 43a and 43b. Further, an inner spacer on a sidewall of the third gate structure G3 may be defined as a third inner spacer 44.

Subsequently, a third ion implantation process 48 may be performed using the inner spacers 42a, 42b, 43a, 43b, and 44 and the gate structures G1 to G4 as an ion implantation mask to form intermediate concentration regions 51a, 51b, and 51c.

In some embodiments, among the intermediate concentration regions 51a, 51b, and 51c, an intermediate concentration region in the active region between the first and second gate structures G1 and G2 adjacent to each other may be defined as a first intermediate concentration region 51a, an intermediate concentration region in the active region between the second and third gate structures G2 and G3 adjacent to each other may be defined as a second intermediate concentration region 51b, and an intermediate concentration region in the active region adjacent to one of both sidewalls of the first gate structure G1, which is farther from the common region 5c, may be defined as a third intermediate concentration region 51c.

The first to third intermediate concentration regions 51a, 51b, and 51c may have the same depth. The first to third intermediate concentration regions 51a, 51b, and 51c may have shallower depths than the low concentration regions 30a, 30c, and 39. That is, the first intermediate concentration region 51a may have a shallower depth than the first low concentration region 30a and side and bottom surfaces of the first intermediate concentration region 51a may be surrounded by the first low concentration region 30a. Likewise, the third intermediate concentration region 51c may have a shallower depth than the third low concentration region 30c and side and bottom surfaces of the third intermediate concentration region 51c may be surrounded by the third low concentration region 30c. Further, the second intermediate concentration region 51b may have a shallower depth than the second low concentration region 39 and side and bottom surfaces of the second intermediate concentration region 51b may be surrounded by the second low concentration region 39.

The third ion implantation process 48 for forming the first to third intermediate concentration regions 51a, 51b, and 51c may be performed using a lower ion implantation energy than the second ion implantation process 36 for forming the second low concentration region 39, for example, using an ion implantation energy of about 20 keV to about 35 keV. Further, the third ion implantation process 48 for forming the first to third intermediate concentration regions 51a, 51b, and 51c may be performed at an amount of dose larger than that of the second ion implantation process 36 for forming the second low concentration region 39, for example, at a dose of about $1\times10^{14}$ ions/cm$^2$ to about $1\times10^{15}$ ions/cm$^2$. The first to third intermediate concentration regions 51a, 51b, and 51c may have higher impurity concentrations than the first to third low concentration regions 30a, 39, and 30c.

Figure 8D:
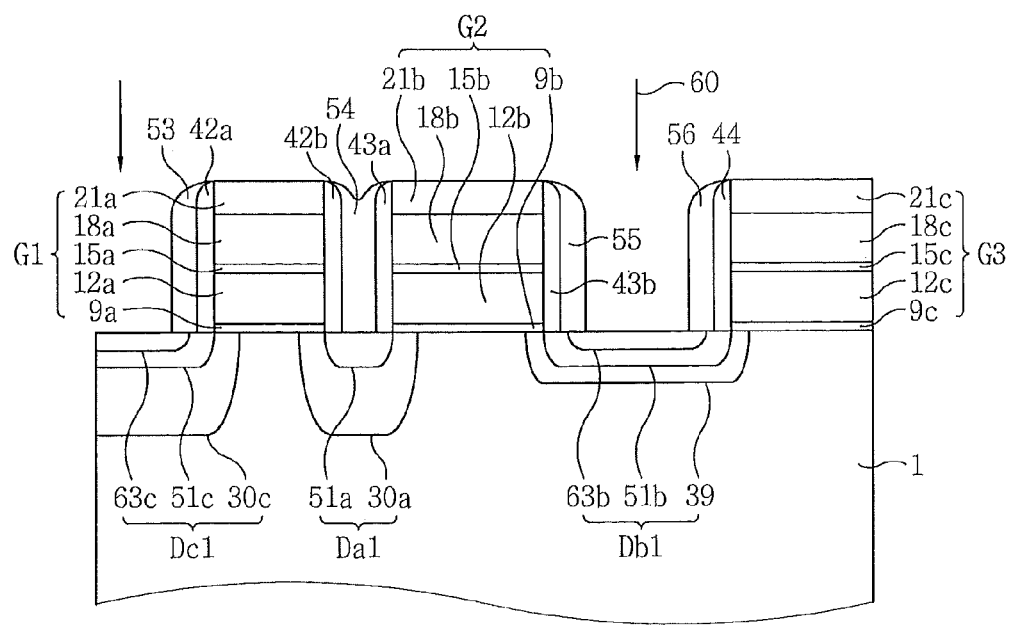

Referring to FIGS. 1 and 8D, an outer spacer layer may be provided on the substrate including the first to third intermediate concentration regions 51a, 51b and 51c and anisotropically etched. As a result, a spacer pattern 54 may fill an empty space between the first and second gate structures G1 and G2 adjacent to each other and to be disposed on the first intermediate concentration region 51a. At the same time, outer spacers 55 and 56 may be provided on the respective sidewalls of the second and third gate structures G2 and G3, which are adjacent to the common region 5c, respectively and an outer spacer 53 may be provided on a sidewall of the first gate structure G1, which is adjacent to the third intermediate concentration region 51c.

A fourth ion implantation process 60 may be performed using the spacer pattern 54, the outer spacers 53, 54, and 55, the inner spacers 42a, 42b, 43a, 43b, and 44, and the gate structures G1 to G4 as an ion implantation mask to form high concentration regions having substantially the same depth in the active region.

Among the high concentration regions, a high concentration region in the second intermediate concentration region 51b may be defined as a first high concentration region 63b and a high concentration region in the third intermediate concentration region 51c may be defined as a second high concentration region 63c. Here, the fourth ion implantation process 60 for forming the high concentration regions 63b and 63c may be performed using a lower ion implantation energy than the third ion implantation process (48 of FIG. 8C) for forming the intermediate concentration region 51a, 51b, and 51c, for example, with an ion implantation energy of about 3 keV to about 15 keV at an amount of dose larger than that of the third ion implantation process (48 of FIG. 8C) for forming the intermediate concentration regions 51a, 51b, and 51c, for example, at a dose of about $1\times10^{15}$ ions/cm$^2$ to about $7\times10^{15}$ ions/cm$^2$. Therefore, the first and second high concentration regions 63b and 63c may have shallower depths than the second and third intermediate concentration regions 51b and 51c. Furthermore, side and bottom surfaces of the first high concentration region 63b may be surrounded by the second intermediate concentration region 51b and side and bottom surfaces of the second high concentration region 63c may be surrounded by the third intermediate concentration region 51c.

In some embodiments, the first low concentration region 30a and the first intermediate concentration region 51a may be defined as a first doped region Da1. The second low concentration region 39, the second intermediate concentration region 51b, and the first high concentration region 63b may be defined as a second doped region Db1. The third low concentration region 30c, the third intermediate concentration region 51c, and the second high concentration region 63c may be defined as a third doped region Dc1. Therefore, the first to third doped regions Da1, Db1, and Dc1 that were described in FIG. 2 may be provided.

Figure 8E:
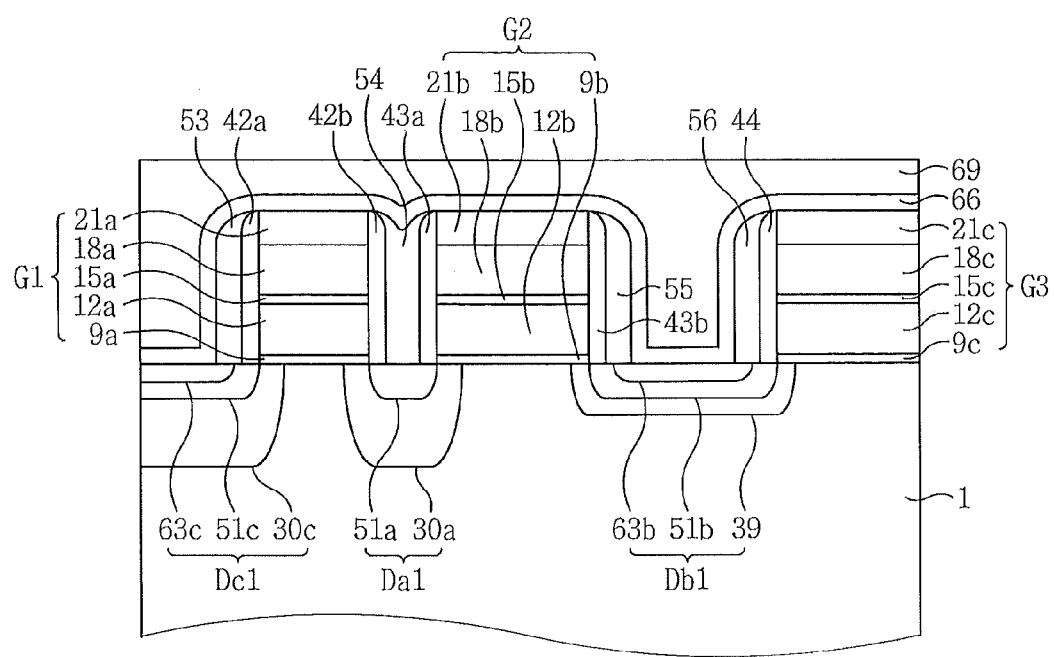

Referring to FIGS. 1 and 8E, an etch stop layer 66 may be provided on the substrate including the first to third doped regions Da1, Db1, and Dc1. The etch stop layer 66 may comprise an insulating material. For example, when the device isolation region 5s comprises silicon oxide, the etch stop layer 66 may comprise a different material from silicon oxide, for example, silicon nitride to prevent the device isolation region 5s from being over-etched. An interlayer insulating layer 69 may be provided on the substrate including the etch stop layer 66. The interlayer insulating layer 69 may comprise silicon oxide.

Subsequently, as shown in FIGS. 1 and 2, the first contact plug 75 penetrating the interlayer insulating layer 69 and the etch stop layer 66 and electrically connected to the second doped region Db1, and a second contact plug 76 electrically connected to the third doped region Dc1 may be provided. Here, the first contact plug 75 may be provided on the second doped region Db1 provided in the common region 5c disposed between a second device region 5d2 and a third device region 5d3 of device regions, which have a relatively large distance. The first and second contact plugs 75 and 76 may include polysilicon, metal, metal silicide and/or the like.

The first conductive pattern 80 covering the first contact plug 75 and the second conductive pattern 81 covering the second contact plug 76 may be provided on the interlayer insulating layer 69. The plurality of second conductive patterns 81 may be provided to overlap the device regions 5d1, 5d2, and 5d3, respectively. The first and second conductive patterns 80 and 81 may include metal silicide or metal.

Next, methods of fabricating a semiconductor device for forming the semiconductor device of FIG. 3 will be described with reference to FIGS. 9A and 9B.

Figure 9A:
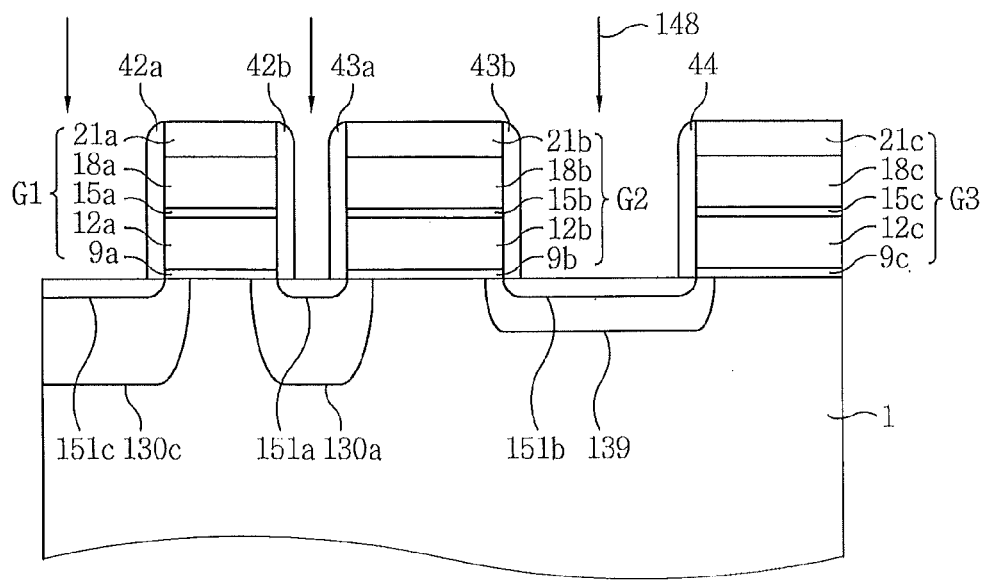
FIGS. 9A and 9B are cross-sectional views illustrating methods of fabricating a semiconductor device according to various other embodiment described herein.

Referring to FIGS. 1 and 9A, first to fourth gate structures G1 to G4 may be provided on a substrate 1 including an active region 5a with further reference to FIG. 8A. The first and second ion implantation processes 27 and 36 may be performed to form first to third low concentration regions 130a, 139, and 130c with further reference to FIGS. 8A and 8B and inner spacers 42a, 42b, 43a, 43b, and 44 may be provided on sidewalls of the first to fourth gate structures G1 to G4 with further reference to FIG. 8C.

Subsequently, a third ion implantation process 148 may be performed using the first to fourth gate structures G1 to G4 and the inner spacers 42a, 42b, 43a, 43b, and 44 as an ion implantation mask to form first to third intermediate concentration regions 151a, 151b, and 151c.

Figure 9B:
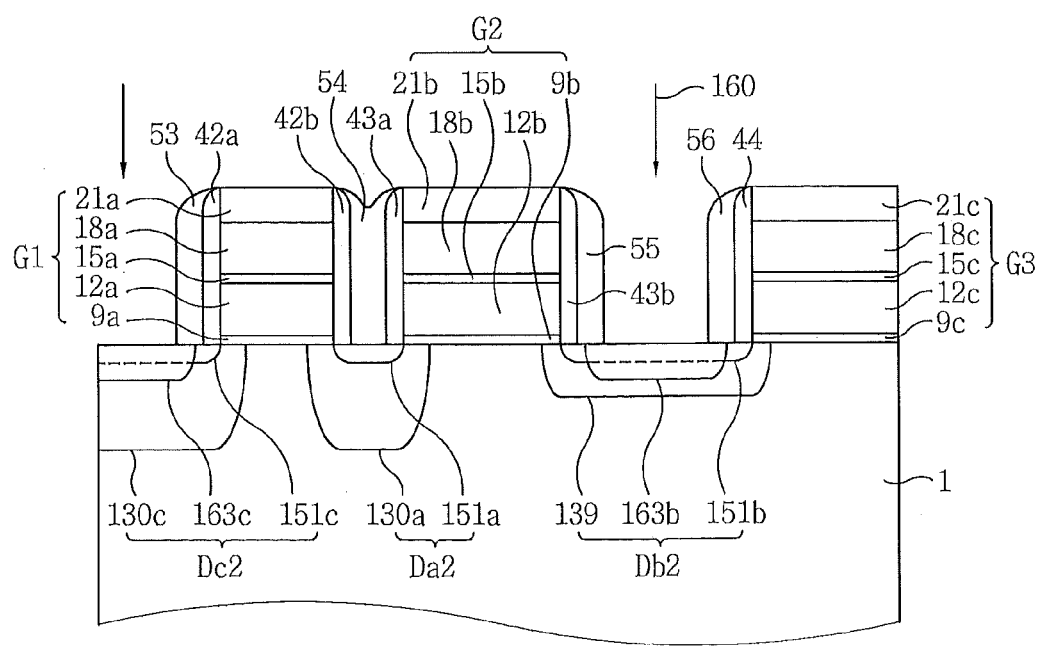

Referring to FIGS. 1 and 9B, a spacer pattern 54 configured to fill an empty space between the first and second gate structures G1 and G2 adjacent to each other and disposed on the first intermediate concentration region 151a, outer spacers 55 and 56 disposed on the respective sidewalls of the second and third gate structures G2 and G3, which are adjacent to the common region 5c, and an outer spacer 53 disposed on a sidewall of the first gate structure G1 adjacent to the third intermediate concentration region 51c may be provided with further reference to FIG. 8D.

A fourth ion implantation process 160 may be performed using the spacer pattern 54, the outer spacers 53, 55, and 56, the inner spacers 42a, 42b, 43a, 43b, and 44, and the gate structures G1 to G4 as an ion implantation mask to form high concentration regions having the same depth in the active region.

Among the high concentration regions, a high concentration region in the second intermediate concentration region 151b may be defined as a first high concentration region 163b and a high concentration region in the third intermediate concentration region 151c may be defined as a second high concentration region 163c.

The fourth ion implantation process 160 for forming the first and second high concentration regions 163b and 163c may be performed with a higher ion implantation energy than the third ion implantation process (148 of FIG. 9A) for forming the first to third intermediate concentration regions 151a, 151b, and 151c. Therefore, the first and second high concentration regions 163b and 163c may have deeper depths than the first to third intermediate concentration regions 151a, 151b, and 151c.

The first low concentration region 130a and the first intermediate concentration region 151a may be defined as a first doped region Da2. The second low concentration region 139, the second intermediate concentration region 151b, and the first high concentration region 163b may be defined as a second doped region Db2. The third low concentration region 130c, the third intermediate concentration region 151c, and the second high concentration region 163c may be defined as a third doing region Dc2. Therefore, the first to third doped regions Da2, Db2, and Dc2 may be provided as was described in FIG. 3.

Next, methods of fabricating a semiconductor device for forming the semiconductor device described in FIG. 4 will be described with reference to FIGS. 10A to 10D.

Figure 10A:
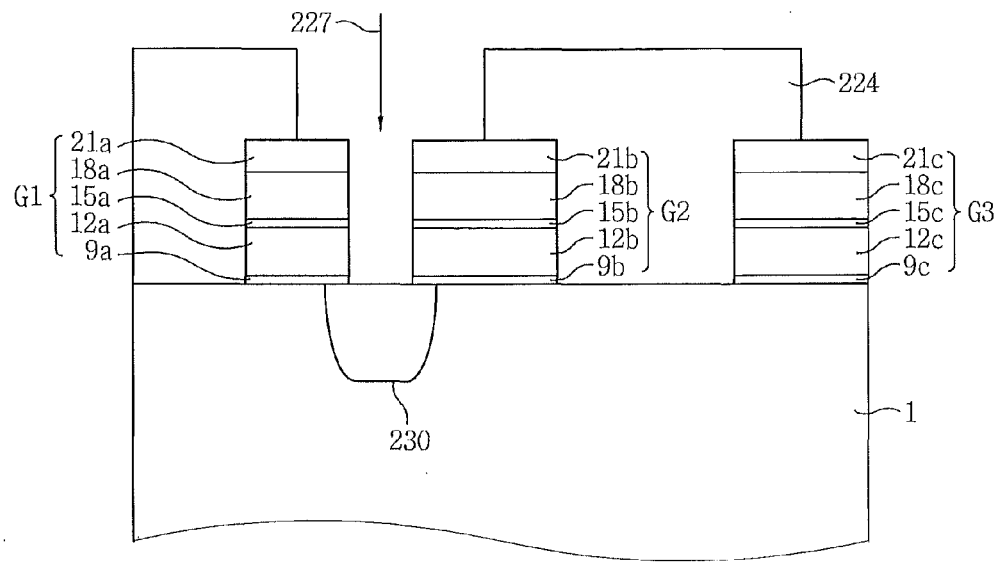
FIGS. 10A to 10D are cross-sectional views illustrating methods of fabricating a semiconductor device according to still various other embodiments described herein.

Referring to FIGS. 1 and 10A, first to fourth gate structures G1 to G4 may be provided on a substrate 1 including an active region 5a with further reference to FIG. 8A.

A first mask 224 which covers the active region 5a between the second and third gate structures G2 and G3 adjacent to each other and the active region 5a adjacent to one of both sidewalls of the first gate structure G1, which is relatively farther from the common region 5c and exposes the active region 5a between the first and second gate structures G1 and G2 may be provided. The first mask 224 may be a photoresist pattern.

A first ion implantation process 227 may be performed using the first mask 224 and the gate structures G1 to G4 as an ion implantation mask to form a first low concentration region 230 in the active region 5a between the first and second gate structures G1 and G2 adjacent to each other.

Subsequently, the first mask 224 may be removed.

Figure 10B:
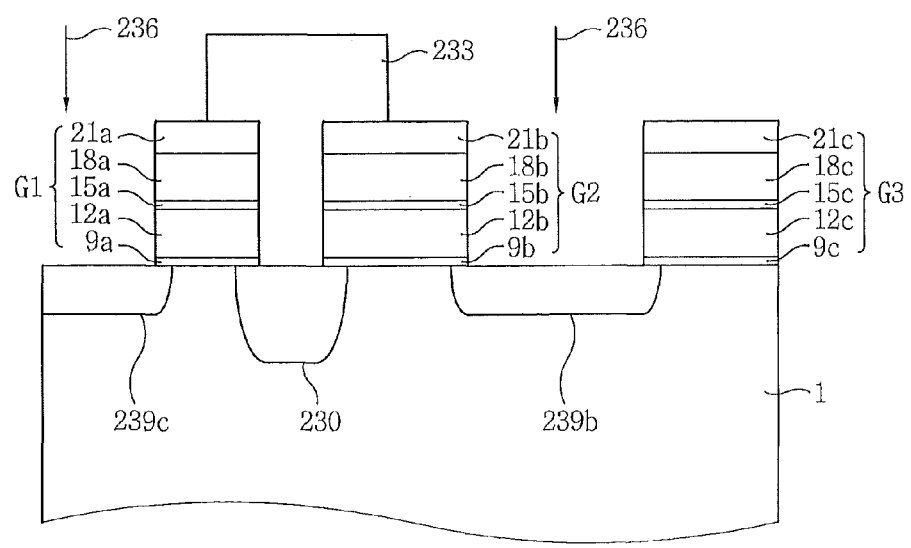

Referring to FIGS. 1 and 10B, a second mask 233 which exposes the active region between the second and third gate structures G2 and G3 adjacent to each other and the active region adjacent to one of both sidewalls of the first gate structure G1, which is relatively farther from the common region 5c and covers the active region between the first and second gate structures G1 and G2 may be performed. The second mask 233 may comprise a photoresist pattern.

A second ion implantation process 236 may be performed using the second mask 233 and the gate structures G1 to G4 as an ion implantation mask to form a second low concentration region 239b in the active region between the second and third gate structures G2 and G3 adjacent to each other and a third low concentration region 239c in the active region adjacent to the sidewall of both sidewalls of the first gate structure G1, which is relatively farther from the common region 5c.

The second and third low concentration regions 239b and 239c are formed by the second ion implantation process 236, and thus the second and third low concentration regions 239b and 239c may have the same impurity concentration and the same depth. The second and third low concentration regions 239b and 239c may have shallower depths than the first low concentration region 230. For example, the first ion implantation process 227 for forming the first low concentration region 230 may be performed using an ion implantation energy of about 50 keV to about 60 keV. The second ion implantation process 236 for forming the second and third low concentration regions 239b and 239 may be performed using an ion implantation energy of about 30 keV to about 40 keV.

Subsequently, the second mask 236 may be removed.

Figure 10C:
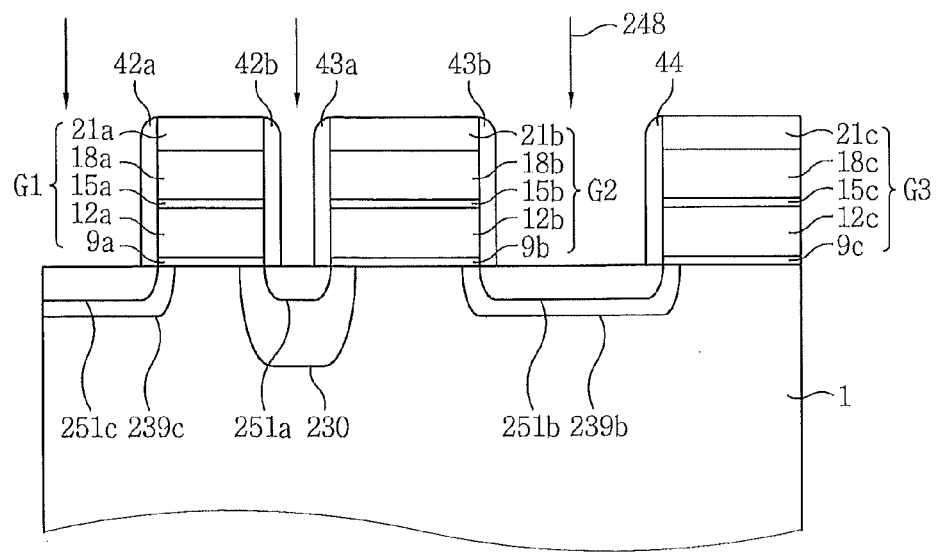

Referring to FIGS. 1 and 10C, inner spacers 42a, 42b, 43a, 43b, and 44 may be provided on sidewalls of the first to fourth gate structures G1 to G4 with further reference to FIG. 8C. A third ion implantation process 248 may be performed using the first to fourth gate structures G1 to G4 and the inner spacers 42a, 42b, 43a, 43b, and 44 as an ion implantation mask to form first to third intermediate concentration regions 251a, 251b, and 251c.

The third ion implantation process 248 for forming the first to third intermediate concentration regions 251a, 251b, and 251c may be performed using a lower ion implantation energy than the first and second ion implantation processes 227 and 236 for forming the first to third low concentration regions 230, 239b, and 239c. Therefore, the first to third intermediate concentration regions 251a, 251b, and 251c may have shallower depths than the first to third low concentration regions 230, 239b, and 239c.

Figure 10D:
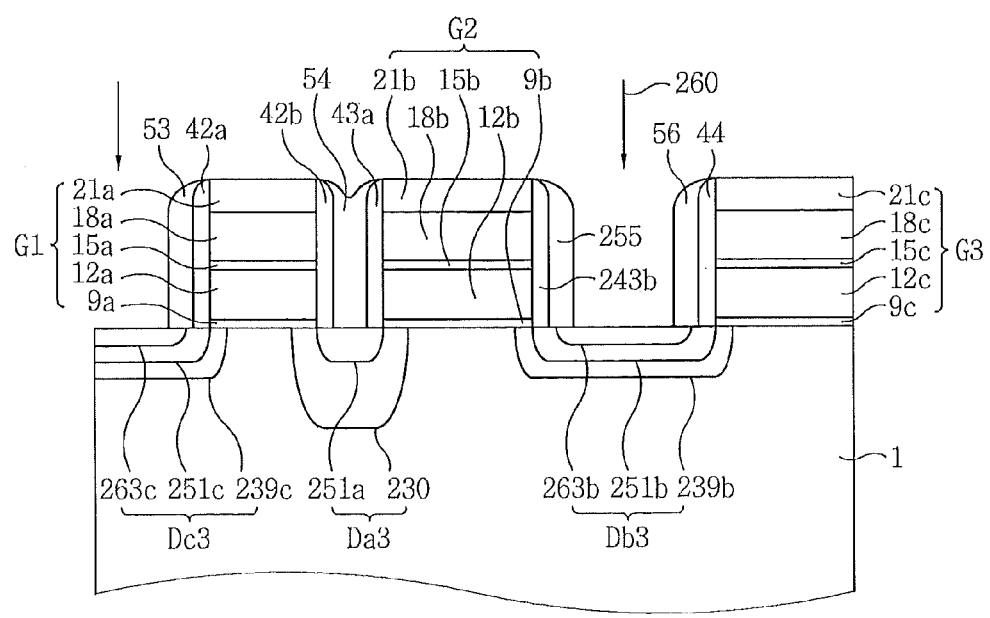

Referring to FIGS. 1 and 10D, a spacer pattern 54 configured to fill an empty space between the first and second gate structures G1 and G2 adjacent to each other and disposed on the first intermediate concentration region 251a, outer spacers 55 and 56 disposed on the respective sidewalls of the second and third gate structures G2 and G3 adjacent to the common region 5c, and an outer spacer 53 disposed on a sidewall of the first gate structure G1 adjacent to the third intermediate concentration region 251c may be provided with further reference to FIG. 8D.

A fourth ion implantation process 260 may be performed using the spacer pattern 54, the outer spacers 53, 55, and 56, the inner spacers 42a, 42b, 43a, 43b, and 44, and the gate structures G1 to G4 as an ion implantation mask to form high concentration regions having the same depth in the active region.

Among the high concentration regions, a high concentration region in the second intermediate concentration region 251b may be defined as a first high concentration region 263b and a high concentration region in the third intermediate concentration region 251c may be defined as a second high concentration region 263c.

The fourth ion implantation process 260 for forming the first and second high concentration regions 263b and 263c may be performed using a lower ion implantation energy lower than the third ion implantation process 248 for forming the first to third intermediate concentration regions 251a, 251b, and 251c. Therefore, the first and second high concentration regions 263b and 263c may have shallower depths than the second and third intermediate concentration regions 251b and 251c.

The first low concentration region 230 and the first intermediate concentration region 251a may be defined as a first doped region Da3. The second low concentration region 239b, the second intermediate concentration region 251b, and the first high concentration region 263b may be defined as a second doped region Db3. The third low concentration region 239c, the third intermediate concentration region 251c, and the second high concentration region 263c may be defined as a third doped region Dc3. Therefore, the first to third doped regions Da3, Db3, and Dc3 may be provided as was described in FIG. 4.

Next, methods of fabricating a semiconductor device for forming the semiconductor device described in FIG. 5 will be described with reference to FIGS. 11A and 11B.

Figure 11A:
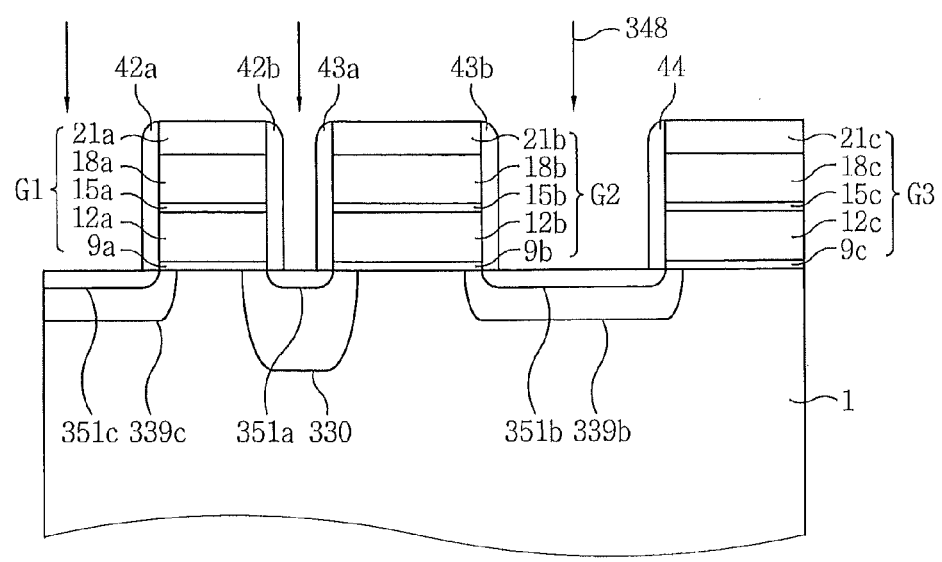
FIGS. 11A and 11B are cross-sectional views illustrating methods of fabricating a semiconductor device according to yet various other embodiments described herein.

Referring to FIGS. 1 and 11A, first to fourth gate structures G1 to G4 may be provided on a substrate 1 including an active region 5a with further reference to FIG. 8A. Subsequently, after two processes, that is, the first and second ion implantation processes 227 and 236 as shown in FIGS. 10A and 10B are performed to form first to third low concentration regions 330, 339b, and 339c, inner spacers 42a, 42b, 43a, 43b, and 44 may be provided on sidewalls of the first to fourth gate structures G1 to G4 with further reference to FIG. 8C.

Subsequently, a third ion implantation process 348 may be performed using the first to fourth gate structures G1 to G4 and the inner spacers 42a, 42b, 43a, 43b, and 44 as an ion implantation mask to form first to third intermediate concentration regions 351a, 351b, and 351c. The first to third intermediate concentration regions 351a, 351b, and 351c may have shallower depths than the second to third low concentration regions 339b and 339c.

Figure 11B:
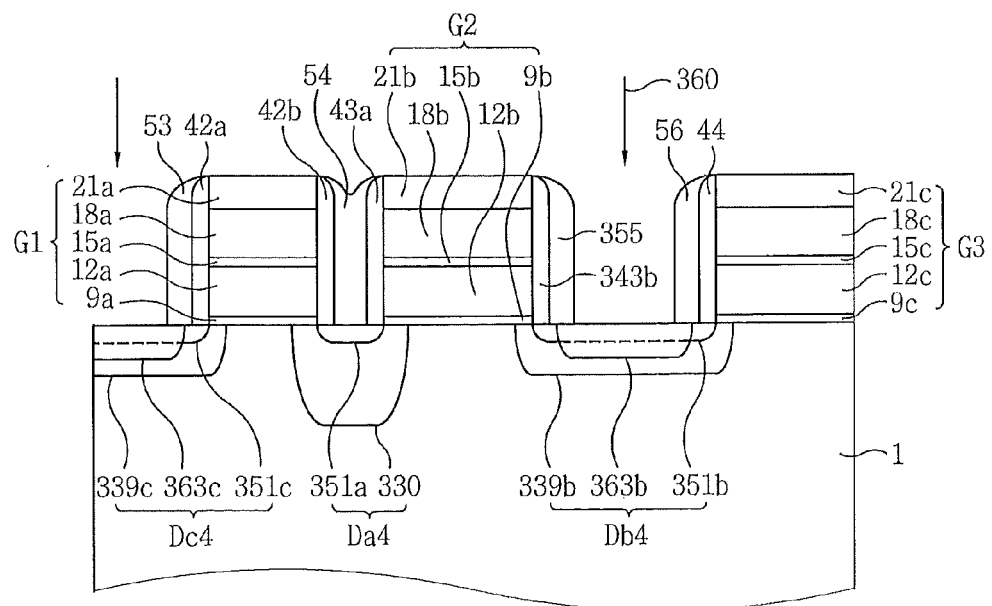

Referring to FIGS. 1 and 11B, a spacer pattern 54 configured to fill an empty space between the first and second gate structures G1 and G2 adjacent to each other and disposed on the first intermediate concentration region 351a, outer spacers 55 and 56 disposed on the respective sidewalls of the second and third gate structures G2 and G3, which are adjacent to the common region 5c, and an outer spacer 53 disposed on a sidewall of the first gate structure G1 adjacent to the third intermediate concentration region 351c may be provided.

A fourth ion implantation process 360 may be performed using the spacer pattern 54, the outer spacers 53, 55, and 56, the inner spacers 42a, 42b, 43a, 43b, and 44, and the gate structures G1 to G4 as an ion implantation mask to form high concentration regions having the same depth in the active region.

Among the high concentration regions, a high concentration region in the second intermediate concentration region 351b may be defined as a first high concentration region 363b and a high concentration region in the third intermediate concentration region 351c may be defined as a second high concentration region 363c.

The fourth ion implantation process 360 for forming the first and second high concentration regions 363b and 363c may be performed with a higher ion implantation energy than the third ion implantation process (348 of FIG. 11A) for forming the first to third intermediate concentration regions 351a, 351b, and 351c. Therefore, the first and second high concentration regions 363b and 363c may have deeper depths than the first to third intermediate concentration regions 351a, 351b, and 351c.

The first low concentration region 330 and the first intermediate concentration region 351a may be defined as a first doped region Da4. The second low concentration region 339b, the second intermediate concentration region 351b, and the first high concentration region 363b may be defined as a second doped region Db4. The third low concentration region 339c, the third intermediate concentration region 351c, and the second high concentration region 363c may be defined as a third doped region Dc4. Therefore, the first to third doped regions Da4, Db4, and Dc4 may be provided as described in FIG. 5.

Next, methods of fabricating a semiconductor device for forming the semiconductor device described in FIG. 6 will be described with reference to FIG. 12.

Figure 12:
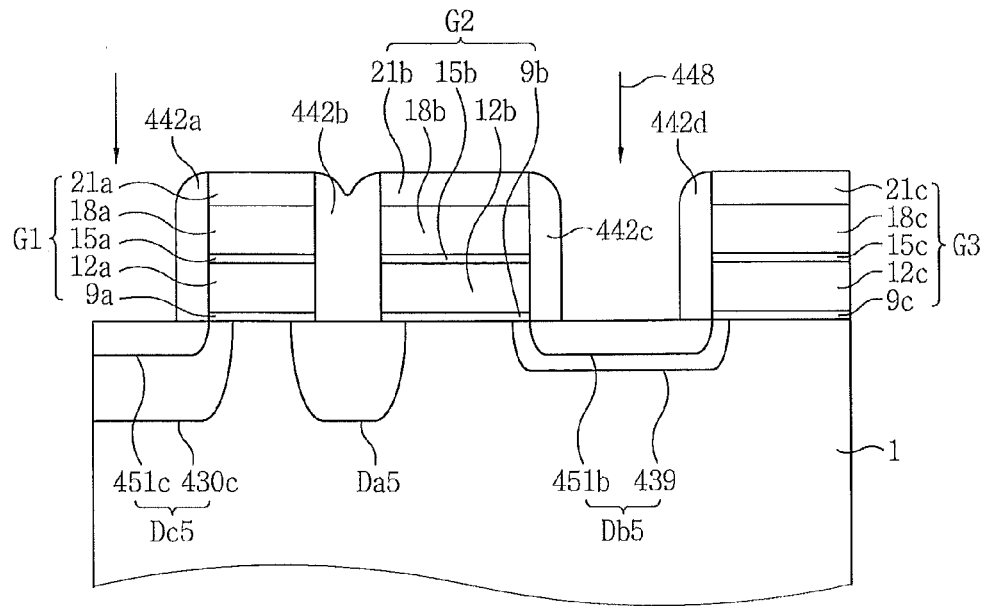
FIG. 12 is a cross-sectional view illustrating methods of fabricating a semiconductor device according to yet various other embodiments described herein.

Referring to FIGS. 1 and 12, first to fourth gate structures G1 to G4 may be provided on a substrate 1 including an active region 5a with further reference to FIG. 8A. With further reference to FIGS. 8A and 8B, the first and second ion implantation processes 27 and 36 may be performed to form first to third low concentration regions 430, 439, and 430c.

A spacer layer may be provided on the substrate including the first to fourth gate structures G1 to G4 and the first to third low concentration regions 430, 439, and 430c. Here, the spacer layer may be provided to fill a space between the first and second gate structures G1 and G2.

The spacer layer may be anisotropically etched. As a result, a first spacer 442a may be provided on a sidewall of the first gate structure G1 adjacent to the third low concentration region 430c, a spacer structure 442b may be provided to fill a space between the first and second gate structures G1 and G2, a second pacer 442c may be provided on a sidewall of the second gate structure G2 adjacent to the second low concentration region 439, and the third spacer 442d may be provided on a sidewall of the third gate structure G3 adjacent to the second low concentration region 439.

Subsequently, a third ion implantation process 448 may be performed using the spacers 442a, 442b, 442c, and 442d and the first to fourth gate structures G1 to G4 as an ion implantation mask to form first and second high concentration regions 451b and 451c. The first high concentration region 451b may have a shallower depth than the second low concentration region 439 and side and bottom surfaces of the first high concentration region 451b may be surrounded by the second low concentration region 439. The second high concentration region 451c may have a shallower depth than the third low concentration region 430c and side and bottom surfaces of the second high concentration region 451c may be surrounded by the third low concentration region 430c.

The first low concentration region 430 may be defined as a first doped region Da5, the second low concentration region 439 and the first high concentration region 451b may be defined as a second doped region Db5, and the third low concentration region 430c and the second high concentration region 451c may be defined as a third doped region Dc5. Therefore, the first to third doped regions Da5, Db5, and Dc5 may be provided as described in FIG. 6.

Figure 13:
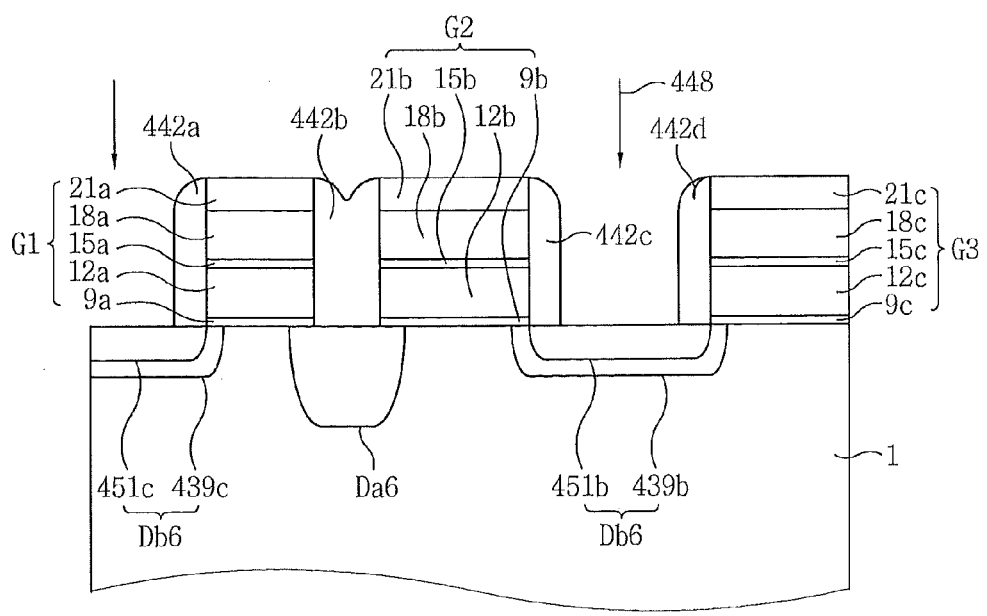
FIG. 13 is a cross-sectional view illustrating methods of fabricating a semiconductor device according to yet various other embodiments described herein.

Next, methods of fabricating a semiconductor device for forming the semiconductor device described in FIG. 7 with reference to FIG. 13.

Referring to FIGS. 1 and 13, first to fourth gate structures G1 to G4 may be provided on a substrate 1 including an active region 5a with further reference to FIG. 8A. With further reference to FIGS. 10A and 10B, two processes, that is, the first and second ion implantation processes 227 and 236 may be performed to form first to third low concentration regions 530, 539b, and 539c. Subsequently, a first spacer 442a, a spacer structure 442b, a second spacer 442c, and a third spacer 442d may be provided as shown in FIG. 12.

A third ion implantation process 548 may be performed using the spacers 442a, 442b, 442c, and 442d and the first to fourth gate structures G1 to G4 as an ion implantation mask to form first and second high concentration regions 551b and 551c. The first high concentration region 551b may have a shallower depth than the second low concentration region 539b and side and bottom surfaces of the first high concentration region 551b may be surrounded by the second low concentration region 539b. The second high concentration region 551c may have a shallower depth than the third low concentration region 539c and side and bottom surfaces of the second high concentration region 551c may be surrounded by the third low concentration region 539c.

The first low concentration region 530 may be defined as a first doped region Da6, the second low concentration region 539b and the first high concentration region 551b may be defined as a second doped region Db6, and the third low concentration region 539c and the second high concentration region 551c may be defined as a third doped region Dc6. Therefore, the first to third doped regions Da6, Db6, and Dc6 may be provided as was described in FIG. 7.

Figure 14:
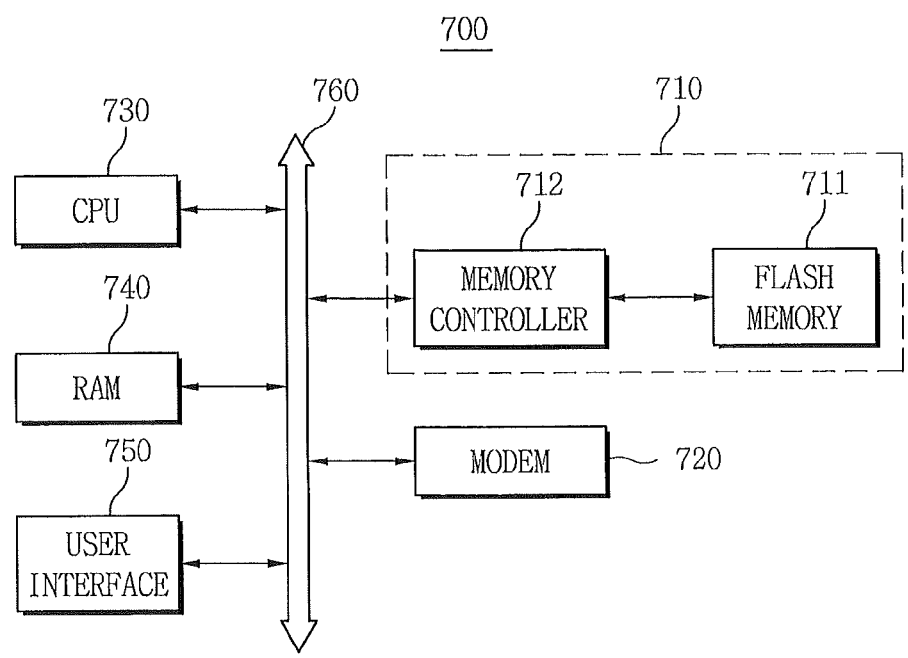
FIG. 14 is a block diagram illustrating a data processing system according to various embodiments described herein.

FIG. 14 a block diagram illustrating a data processing system according to various embodiments described herein.

Referring to FIG. 14, a data processing system 700 may include a flash memory system 710 including the semiconductor device according to any one of the various embodiments described herein. The flash memory system 710 may include a flash memory 711 and a memory controller 712.

The data processing system 700 may include a mobile appliance, a computer, or the like. For example, the data processing system 700 may include a modem 720, a central processing unit (CPU) 730, a random access memory (RAM) 740, and/or a user interface 750 electrically connected to the flash memory system 710, respectively through a system bus 760. Data processed by the CPU 730 or externally input may be stored in the flash memory system 710.

The data processing system 700 may be provided as a memory card, a solid state disk (SSD), a camera image sensor, and/or other application chipsets. For example, the flash memory system 710 may be constituted by a SSD and in this case, the data processing system 700 can stably and reliably store data of large capacity in the flash memory system 710.

As was illustrated in FIGS. 1-13 and described herein, a semiconductor device according to various embodiments described herein includes first, second and third gate structures sequentially arranged on an active region of a semiconductor substrate and spaced apart from one another, wherein adjacent surfaces of the first and second gate structures and adjacent surfaces of the second and third gate structures are spaced apart from one another by different distances. A first doped region is provided in the active region between the first and second gate structures, and a second doped region is provided in the active region between the second and third gate structures. The first doped region overlaps the second gate structure and the second doped region overlaps the second gate structure by different distances and/or the first doped region and the second doped region extend into the semiconductor substrate to different depths.

The adjacent surfaces of the first and second gate structures may be closer together than the adjacent surfaces of the second and third gate structures. Moreover, the first doped region may overlap the second gate structure more than the second doped region overlaps the second gate structure and/or the first doped region may extend deeper into the semiconductor substrate than the second doped region.

The second and third gate structures may have the same width, and the widths of the second and third gate structures may be different than that of the first gate structure. Moreover, the first and second doped regions may include different numbers of sub-regions of different doping concentrations.

Finally, the first gate structure may include a first gate dielectric, a first lower conductive pattern, a first intermediate dielectric, and a first upper conductive pattern, which are sequentially stacked, and each of the second and third gate structures may include a second gate dielectric, a second lower conductive pattern, a second intermediate dielectric, and a second upper conductive pattern, which are sequentially stacked.

According to the above-described exemplary embodiments, first and second doped regions can be provided in an active region at both sides of a gate structure to have different depths. Further, the first and second doped regions can be provided so that an overlapping width between the gate structure and the first doped region is different from that between the gate structure and the second doped region. Thereby, a transistor including doped regions having an asymmetric structure can be provided so that an effective channel length of the transistor can be ensured and degradation of electrical characteristics of the transistor due to punch-through can be reduced or prevented.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A semiconductor device comprising:
a semiconductor substrate including an active region;
first to third gate structures sequentially arranged to cross the active region and spaced apart from each other;
a first doped region in the active region between the first and second gate structures; and
a second doped region in the active region between the second and third gate structures,
wherein a distance between the first and second gate structures adjacent to each other is smaller than a distance between the second and third gate structures adjacent to each other,
a width of the first doped region is smaller than a width of the second doped region, and
the first doped region has a depth deeper than a depth of the second doped region.

2. The semiconductor device of claim 1, wherein a width of an overlapping portion between the second gate structure and the first doped region is larger than that of an overlapping portion between the second gate structure and the second doped region.

3. The semiconductor device of claim 1, wherein the second and third gate structures have same width and the widths of the second and third gate structures are larger than that of the first gate structure.

4. The semiconductor device of claim 1, wherein the first doped region includes a first low concentration region and a first intermediate concentration region,
wherein the first intermediate concentration region has a higher impurity concentration than the first low concentration region and a shallower depth than the first low concentration region, and side and bottom surfaces of the first intermediate concentration region are surrounded by the first low concentration region.

5. The semiconductor device of claim 4, wherein the second doped region includes a second low concentration region, a second intermediate concentration region, and a high concentration region,
wherein the second intermediate concentration region has a depth shallower than a depth of the second low concentration region and side and bottom surfaces of the second intermediate concentration region are surrounded by the second low concentration region, and
the high concentration region has a depth shallower than a depth of the second intermediate concentration region and side and bottom surfaces of the high concentration region are surrounded by the second intermediate concentration region.

6. The semiconductor device of claim 4, wherein the second doped region includes a second low concentration region, a second intermediate concentration region, and a high concentration region,
wherein the second intermediate concentration region has a shallower depth than the second low concentration region and side and bottom surfaces of the second intermediate concentration region are surrounded by the second low concentration region,
the high concentration region has a depth deeper than a depth of the second intermediate concentration region and a smaller width than the second intermediate concentration region, and
the high concentration region has a smaller width than the second low concentration region and a shallower depth than the second low concentration region.

7. The semiconductor device of claim 1, wherein the first doped region includes a first low concentration region and a first intermediate concentration region, the first intermediate concentration region having a depth shallower than a depth of the first low concentration region and side and bottom surfaces surrounded by the first low concentration region, and
the second doped region includes a second low concentration region, a second intermediate concentration region, and a high concentration region,
wherein the second low concentration region has a shallower depth than the first low concentration region, and
the first and second intermediate concentration regions have the same depth.

8. The semiconductor device of claim 1, wherein the second doped region includes a portion having a higher impurity concentration than the first doped region.

9. The semiconductor device of claim 1, further comprising a third doped region in the active region opposite to the first doped region with the first gate structure interposed therebetween,
wherein the third doped region includes a portion having same impurity concentration as the first doped region and has same depth as the first doped region.

10. The semiconductor device of claim 1, further comprising a third doped region in the active region opposite to the first doped region with the first gate structure interposed therebetween,
wherein the third doped region includes a portion having same impurity concentration as the second doped region and has same depth as the second doped region.

11. The semiconductor device of claim 1, wherein the first gate structure includes a first gate dielectric, a first lower conductive pattern, a first intermediate dielectric, and a first upper conductive pattern, which are sequentially stacked, and
each of the second and third gate structures includes a second gate dielectric, a second lower conductive pattern, a second intermediate dielectric, and a second upper conductive pattern, which are sequentially stacked,
wherein the first and second gate dielectrics have the same thickness and comprise a same composition.

12. A semiconductor device comprising:
a semiconductor substrate;
an active region in the semiconductor substrate, including a line-shaped device region and a line-shaped common region crossing the device region;
a first doped region in the active region of the device region;
a second doped region in the active region spaced from the first doped region and extending over the device region adjacent to the common region;
a third doped region in the device region spaced from the first doped region and extending in the device region opposite to the second doped region with the first doped region interposed therebetween;
a first gate structure on the device region between the first and third doped regions;
a second gate structure on the device region between the first and second doped regions; and
a third gate structure on the device region,
wherein the second gate structure is disposed between the first gate structure and the second gate structure,
a distance between the first and second gate structures is smaller than a distance between the second and third gate structures,
the first doped region extends deeper than the second doped region, and
the second doped region has a larger width than the first doped region.

13. The semiconductor device of claim 12, further comprising:
a spacer structure configured to fill a space between the first and second gate structures;
a first spacer on a sidewall of the first gate structure adjacent to the third doped region;
a second spacer on a sidewall of the second gate structure adjacent to the second doped region; and
a third spacer on a sidewall of the third gate structure adjacent to the second doped region.

14. The semiconductor device of claim 12, further comprising:
first inner spacers on both sidewalls of the first gate structure;
second inner spacers on both sidewalls of the second gate structure;
third inner spacers on both sidewalls of the third gate structure;
a spacer pattern configured to fill a space between a first inner spacer and a second inner spacer disposed between sidewalls of the first and second gate structures that are adjacent to each other;
a first outer spacer on the first inner spacer which is disposed on the sidewall of the first gate structure adjacent to the third doped region;
a second outer spacer on the second inner spacer which is disposed on the sidewall of the second gate structure adjacent to the second doped region; and
a third outer spacer on the third inner spacer which is disposed on the sidewall of the third gate structure adjacent to the second doped region,
wherein the second and third outer spacers that are adjacent to each other are spaced from each other.

15. The semiconductor device of claim 12, further comprising:
an interlayer insulating layer on the semiconductor substrate;
a first conductive plug configured to penetrate the interlayer insulating layer and electrically connected to the third doped region;
a second conductive plug configured to penetrate the interlayer insulating layer and electrically connected to the second doped region; and
first and second conductive patterns disposed parallel to each other and configured to cover the first and second conductive plugs, respectively,
wherein the second conductive plug is disposed on the second doped region of the common region which does not intersect with the line-shaped device region.

* * * * *